United States Patent [19]
Izumi et al.

[11] Patent Number: 5,644,151
[45] Date of Patent: Jul. 1, 1997

[54] SEMICONDUCTOR MEMORY DEVICE AND METHOD FOR FABRICATING THE SAME

[75] Inventors: Hirohiko Izumi; Shoichi Iwasa, both of Tokyo, Japan

[73] Assignee: Nippon Steel Corporation, Tokyo, Japan

[21] Appl. No.: 453,975

[22] Filed: May 30, 1995

[30] Foreign Application Priority Data

May 27, 1994 [JP] Japan ................................. 6-138158
Apr. 25, 1995 [JP] Japan ................................. 7-124233

[51] Int. Cl.⁶ .................................................. H01L 27/108
[52] U.S. Cl. .......................... 257/306; 257/310; 257/532; 257/758
[58] Field of Search ................................. 257/306, 310, 257/532, 758

*Primary Examiner*—Mark V. Prenty
*Attorney, Agent, or Firm*—Pollock, Vande Sande & Priddy

[57] ABSTRACT

A pair of electrically conductive regions of ruthenium dioxide are formed on a BPSG film covering DRAM memory cells arranged in a matrix form. The conductive region is extended in a column direction to be connected to one of impurity diffused regions of MOS transistors of the memory cells at contact holes, and also connected to one of impurity diffused regions of MOS transistors of column direction selection. Formed beneath the conductive region (capacitor upper electrodes) are capacitor lower electrodes connected to the other impurity diffused regions of the memory cell MOS transistors and a high-dielectric film. The conductive region is connected to a (½)Vcc power supply. Since the upper electrodes and wiring lines of capacitors can be formed at the same time, the number of steps in a fabrication method can be reduced.

27 Claims, 13 Drawing Sheets

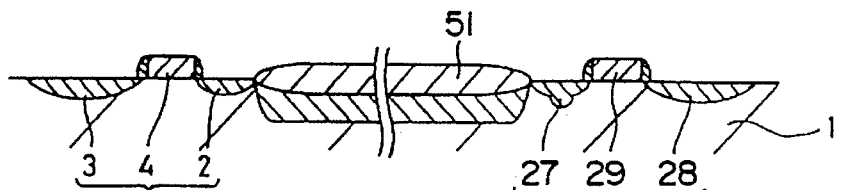
FIG. 7A
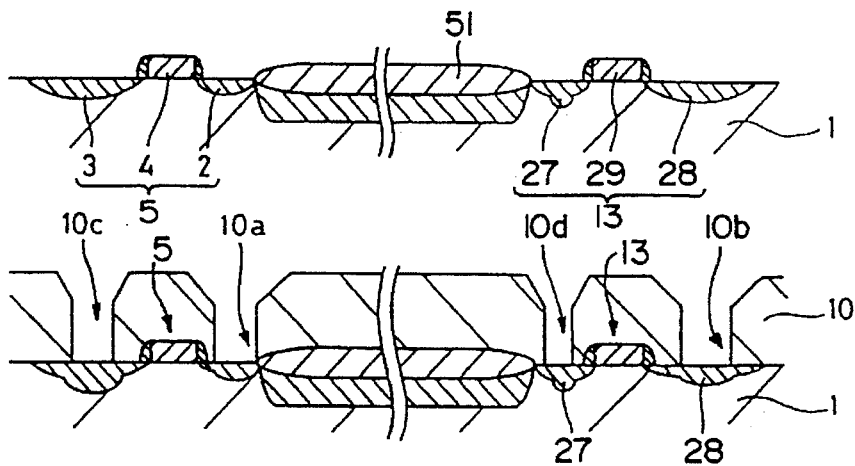
FIG. 7B
FIG. 7C
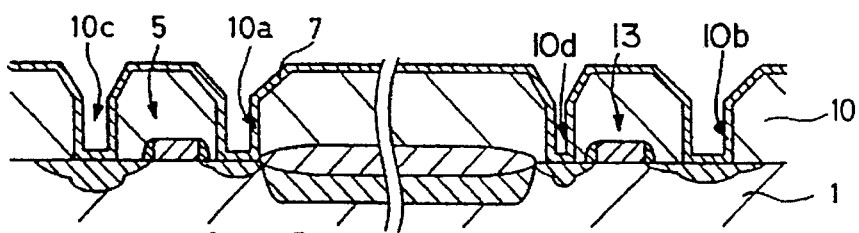
FIG. 7D
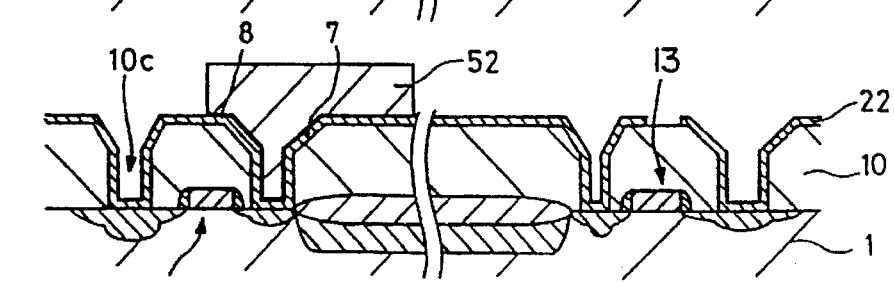
FIG. 7E
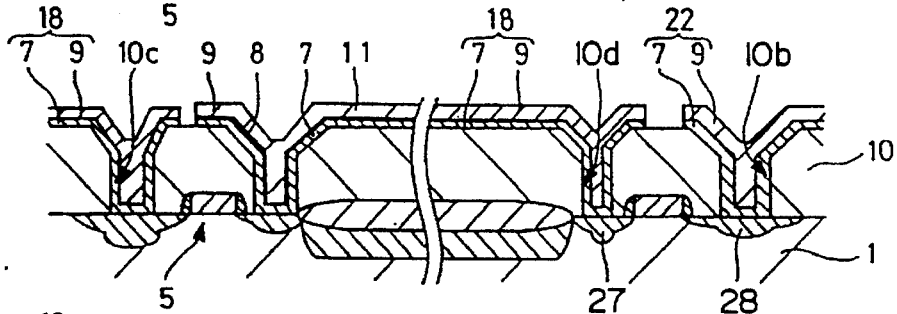
FIG. 7F

SEMICONDUCTOR MEMORY DEVICE AND METHOD FOR FABRICATING THE SAME

FIELD OF THE INVENTION

The present invention relates to a semi-conductor memory device such as dynamic random access memory (DRAM) and to a method for fabricating the device.

BACKGROUND OF THE INVENTION

DRAM predominantly has memory cells each including a single MOS transistor and a single capacitor. In such a one-transistor/one-capacitor type DRAM as the above, as high integration and miniaturization are demanded therefor in these years, stack type capacitor has been employed in place of conventional planar type one in order to compensate for the lack of the intended capacitance of the capacitor caused by a corresponding reduction in the area of memory cells. FIG. 13 shows a cross-sectional view of a part of conventional DRAM memory cells having the aforementioned stack type capacitors, in which a left side in the drawing denotes transistors for addressing of DRAM memory cells and a right side therein denotes transistors for addressing memory cells (which addressing is for column selection).

A group of MOS transistors 105 shown in the left side of FIG. 13 are formed in the following manner. A group of gate electrodes 104 arranged in a matrix form is first formed through a gate oxide film (not shown) on a P type silicon substrate 101 having an inter-element separation region 151 formed therein. Then areas of the substrate 101 located at both sides of the gate electrode group 104 are subjected to an ion implanting operation with use of, e.g., phosphorus to thereby form a plurality of pairs of impurity diffused regions 102 and 103 as source/drain regions.

A group of stack type capacitors 106 forming the DRAM memory cells together with the MOS transistor group 105 each includes a lower electrode 107 having a polycrystalline silicon film containing an impurity, a dielectric film 108 made of, e.g., a silicon oxide film or a 3-layered structure of an oxide layer, a nitride layer and an oxide layer, and an upper electrode 109 provided opposite to the lower electrode 107 with the dielectric film 108 interposed therebetween and having a polycrystalline silicon film containing an impurity. Connected to the lower electrode 107 of the capacitor group 106 is one impurity diffused region 102 of the corresponding MOS transistor in the MOS transistor group 105.

The MOS transistor group 105 and capacitor group 106 are covered with an insulating film 110 such as a boron phosphor silicon glass (BPSG) film. A wiring 111 for fixing a potential of the upper electrode 109 of the capacitor group 106 is connected to the upper electrode 109 of the capacitor group 106 at a contact hole 110a made in the insulating film 110.

Meanwhile, as shown on the right side in FIG. 13, one impurity diffused region 113 of a transistor 112 for column selection of memory cells formed simultaneously with the formation of the MOS transistor group 105, is connected to a wiring (bit line) 118 formed differently from the wiring 111 at a contact hole 110b made in the insulating films 110 and 119. The wiring 118 in turn is connected to the other impurity diffused region 103 of the MOS transistor group 105 (, which connection is not shown). Further sequentially formed on the wirings 111 and 118 are an inter-layer insulating film 114, word lines 115, an insulating film 116 and a protective film 117. Each of the word lines 115 is connected to the associated gate electrode of the gate electrode group 104 in the MOS transistor group 105 and also to a decoder (not shown).

With the DRAM having a structure as mentioned above, since interconnection between the wiring 111 and upper electrode 109 is established by means of the contact hole 110a made in the insulating film 110 on the capacitor 106, an aspect ratio of the contact hole 110b for interconnection between one impurity diffused region 113 of the transistor 112 for column selection of memory cells and the wiring 118 becomes large, that is, the contact hole 110b becomes deep. This involves the problem that coverage of the wiring 118 at the bottom of the contact hole 110b becomes poor and thus it becomes impossible to form the wiring 118 with a high reliability.

Meanwhile, there has been studied in these years a method in which a capacitor dielectric film for DRAM memory cells is made of a material having a high dielectric constant or permittivity to compensate for the lack of the intended capacitance of the capacitor caused by a corresponding reduction in the area of memory cells. This method, however, involves another problem that the above dielectric material, which is different in property from silicon, causes interdiffusion with silicon at a temperature of, e.g., over 700° C. to deteriorate the element characteristics. In the above prior art DRAM fabricating process, the dielectric film 108 is formed and thereafter thermal annealing operations including the reflowing the BPSG film 110 and the activation of the contact of the contact hole 110b after the implantation are carried out at a temperature of over 700° C. Therefore, it has conventionally been difficult to employ a material having a high dielectric constant as a capacitor dielectric film.

In order to prevent the interdiffusion between the capacitor dielectric film of the material with the high dielectric constant and the upper and lower electrodes of the capacitor, it is also considered for the material of these electrodes to be made of electrically conductive oxide material such as ruthenium dioxide. In this case, however, the problem occurs that interdiffusion takes place between the conductive oxide such as ruthenium dioxide and the silicon substrate 101 during the thermal annealing.

Besides this, it is necessary that the bit wiring 118 of the transistors for column selection be formed only after the wiring 111 is formed and then the insulating film 119 covering the wiring 111 is formed on the silicon substrate 101. Further, for the purpose of eliminating an error in resist dimensions in a photo-lithographical technique, it is necessary to flatten the insulating films 110 and 119. However, this causes the problem that the number of steps for fabricating the semiconductor memory device is increased.

SUMMARY OF THE INVENTION

It is therefore an object of the present invention to reduce the number of steps in a process for fabricating a semiconductor memory device such as DRAM having capacitors.

Another object of the invention is to provide a semiconductor memory device such as DRAM having stack type capacitors in which coverage is improved of a contact hole connecting a wiring line and one of impurity diffused regions of peripheral circuit transistors formed simultaneously with formation of memory cell transistors such as, e.g., transistors for addressing memory cells to thereby provide reliable wiring.

A further object of the invention is to provide a semiconductor memory device such as DRAM having stack type capacitors in which a dielectric film having a high dielectric constant is used as a capacitor dielectric film.

In order to attain the above objects, in a semiconductor memory device of the present invention, a wiring layer of capacitor upper electrodes and a wiring layer of bit lines (which will be referred to as the column selection wiring layer, hereinafter) are formed in the same plane on an inter-layer insulating film. On the inter-layer insulating film, further, the capacitor upper electrodes and their wiring layer and the column selection wiring layer may be formed on the same plane as separated from each other. Furthermore, with the semiconductor memory device of the present invention, on the inter-layer insulating film, the wiring layer connected to one of impurity diffused regions of the column selection transistors, the column selection wiring layer connected to the other impurity diffused regions of the column selection transistors and also connected to one impurity diffused regions of memory cell transistors, and the wiring layer of the capacitor upper electrodes of the memory cell transistors may be formed on the same plane. In addition, with the semiconductor memory device of the present invention, on the inter-layer insulating film, the wiring layer connected to one impurity diffused regions of the column selection transistors, the column selection wiring layer connected to the other impurity diffused regions of the column selection transistors and also connected to one impurity diffused region of the memory cell transistors, and the capacitor upper electrodes and their wiring layer of the memory cell transistor may be formed on the same plane.

In accordance with a typical aspect of the present invention, there is provided a semiconductor memory device which has a plurality of memory cells, one of which is selected by a plurality of column selection lines and a plurality of row selection lines. The device comprises a semiconductor substrate; transistors each included in each of the plurality of memory cells and having first and second impurity diffused regions formed within the semiconductor substrate and a gate electrode formed on the semiconductor substrate disposed therebetween; an insulating layer covering the transistors, p, having at least contact holes made therein located on the first and second impurity diffused regions of the transistors; capacitor lower electrodes each included in each of the plurality of memory cells and each formed on the insulating layer to be electrically connected to the first impurity diffused region of associated one of the transistors through associated one of the contact holes made in the insulating layer; a capacitor dielectric film included in the plurality of memory cells and formed on the capacitor lower electrodes; and first and second groups of electrically conductive films extended adjacent to each other in a column direction and electrically separated from each other, each of the first conductive films being connected to one of the column selection lines and also connected to the second impurity diffused region of associated one of the transistors of the plurality of memory cells adjacent to in the column direction through associated one of the contact holes made in the insulating layer, each of the second conductive films being connected to a power supply line, formed on the capacitor dielectric film of the plurality of memory cells adjacent in a row direction, and including parts opposite to the capacitor lower electrodes with the capacitor dielectric film disposed therebetween, the parts being thereby acting as capacitor upper electrodes.

Further, the semiconductor memory device of the present invention may include a group of column selection transistors.

In accordance with another typical aspect of the present invention, there is provided a method for fabricating a semiconductor memory device having a plurality of memory cells, which method comprises the steps of forming a gate insulating film of MOS transistors to be used as transfer gates of the memory cells on a semiconductor substrate; forming gate electrodes on the gate insulating film with respect to the memory cells; forming impurity diffused regions on both sides of each of the gate electrodes to be used as a source and a drain with respect to the memory cells; forming an insulating film over an entire surface of the semiconductor substrate; forming on the insulating film at least first and second contact holes reaching one impurity diffused regions of the MOS transistors and the other respectively; forming on the insulating film a pattern of first electrically conductive film electrically connected to one of impurity diffused regions of the MOS transistors through the first contact hole to be used as capacitor lower electrodes; forming a dielectric film on the first conductive film of the memory cells; and forming patterns of second and third electrically conductive films at the same time, at least part of the second conductive film being opposite to the first conductive film with the dielectric film disposed therebetween to form capacitor upper electrodes, the second conductive film including a wiring layer for the capacitor upper electrodes, the third conductive film being electrically connected to the other impurity diffused regions of the MOS transistors through the second contact holes to form a column selection wiring layer, the second and third conductive films being electrically isolated from each other.

The method for fabricating a semiconductor device in accordance with the present invention may further include forming the group of transistors for column selection.

In accordance with the present invention, the upper electrodes of the capacitors of the memory cells are integrally formed with their wiring lines to eliminate any contact structures therebetween, whereby the electrode wiring lines can be formed in a layer lower than the height level of the surface of the substrate. As a result, the aspect ratio of the contact holes for interconnection between, e.g., the bit wiring lines formed at the same height as the electrode wiring lines and one of impurity diffused regions of such MOS transistors as the column-selection transistors of the memory cells can be made small.

Further, the number of wiring steps in the method for fabricating a semiconductor device such as DRAM having capacitors can be reduced.

In the present invention, furthermore, since an insulating film such as a BPSG film is formed, the contact holes are made in the insulating film, and then the capacitors of the memory cells are formed; the capacitors can be formed, for example, after the reflowing process for the insulating film or the activation process based on contact implantation. For this reason, even when a material such as lead titanate having a high dielectric constant is used as the material of the capacitor dielectric film or electrically conductive oxide material such as ruthenium dioxide film is used as the material of the electrodes of the capacitors, no interdiffusion will take place between the dielectric film of the capacitors and the silicon substrate or between the conductive oxide and the silicon substrate.

BRIEF DESCRIPTION OF THE DRAWINGS

FIGS. 7A to 7F are cross-sectional views, in sequence, of steps in a method for fabricating the DRAM of the third embodiment of the invention;

DESCRIPTION OF THE PREFERRED EMBODIMENTS (First Embodiment)

Explanation will be made first as to a first embodiment of the present invention with reference to FIGS. 1 to 5.

Figure 1:
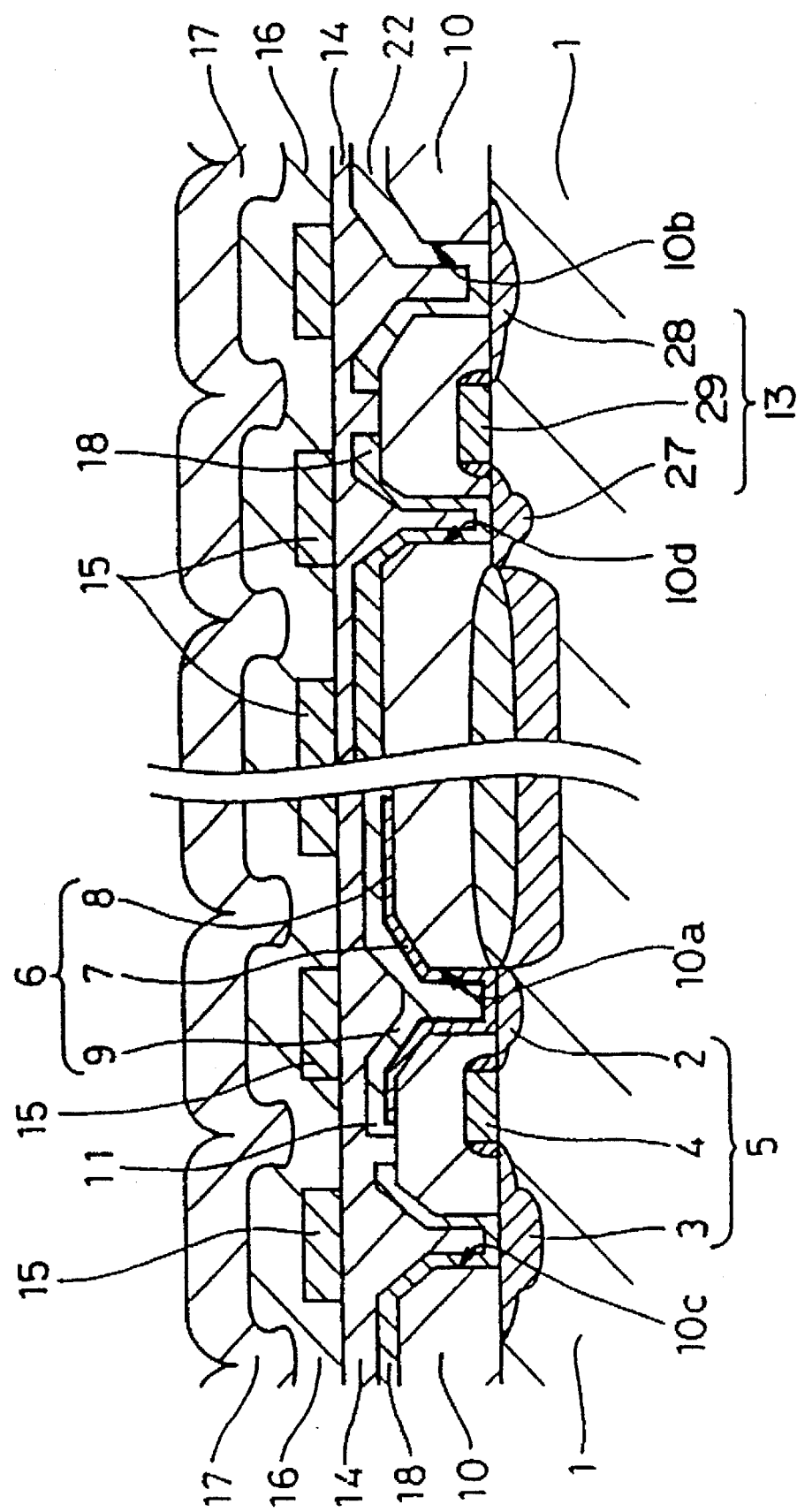
FIG. 1 is a cross-sectional view of a part of a DRAM in accordance with a first embodiment of the present invention.

FIG. 1 is a cross-sectional view of a part of a DRAM in accordance with the first embodiment of the present invention, in which a left side in the drawing represents a memory cell part of the DRAM and a right side represents a transistor part for addressing (column selection) of memory cells.

As shown in the left side of FIG. 1, a plurality of gate electrodes 4 are formed in memory cell formation regions on a P type silicon substrate 1 with a gate oxide film (not shown) interposed therebetween. Areas of the substrate 1 located at both sides of the gate electrode group 4 are subjected to an ion implanting operation with use of, e.g., phosphorus to form a plurality of pairs of impurity diffused regions 2 and 3 as source/drain regions and to form a group of MOS transistors 5.

On the other hand, a group of stack type capacitors 6 forms DRAM memory cells together with the MOS transistor group 5 respectively, and each capacitor 6 includes a lower electrode (storage node) 7, a dielectric film 8, and an upper electrode (cell plate) 9 provided opposite to the lower electrode 7 with the dielectric film 8 disposed therebetween. As shown in FIG. 1, the lower electrodes 7 of the capacitor group 6 are formed on an insulating film 10 including a boron phosphor silicon glass (BPSG) film or a phosphor silicon glass (PSG) film, and each lower electrode is connected to the impurity diffused region 2 of the associated MOS transistor 5 at a contact hole 10a made in the insulating film 10 on the impurity diffused region 2 of the MOS transistor.

The insulating film 10 may be oxygen/TEOS (tetra ethyl ortho silicate) oxide film formed by a low pressure CVD (chemical vapor deposition) process with use of TEOS and oxygen ($O_2$) gases in place of the BPSG film or the PSG film. The BPSG film 10 may also be ozone/TEOS oxide film formed by the low pressure CVD process with use of TEOS and ozone ($O_3$) gases.

Further, the insulating film 10 may have a laminated structure of a PECVD oxide layer and a THCVD oxide film, or a laminated structure of a TEOS/$O_2$ oxide layer and a TEOS/$O_3$ layer. The THCVD oxide layer or the ozone/TEOS oxide film is intended to fill recesses in the surface of the inter-layer insulating film. The insulating film 10 may be formed by a depositing process and then the resultant insulating film may be subjected to an etching-back process to flatten the surface thereof.

Figure 2:
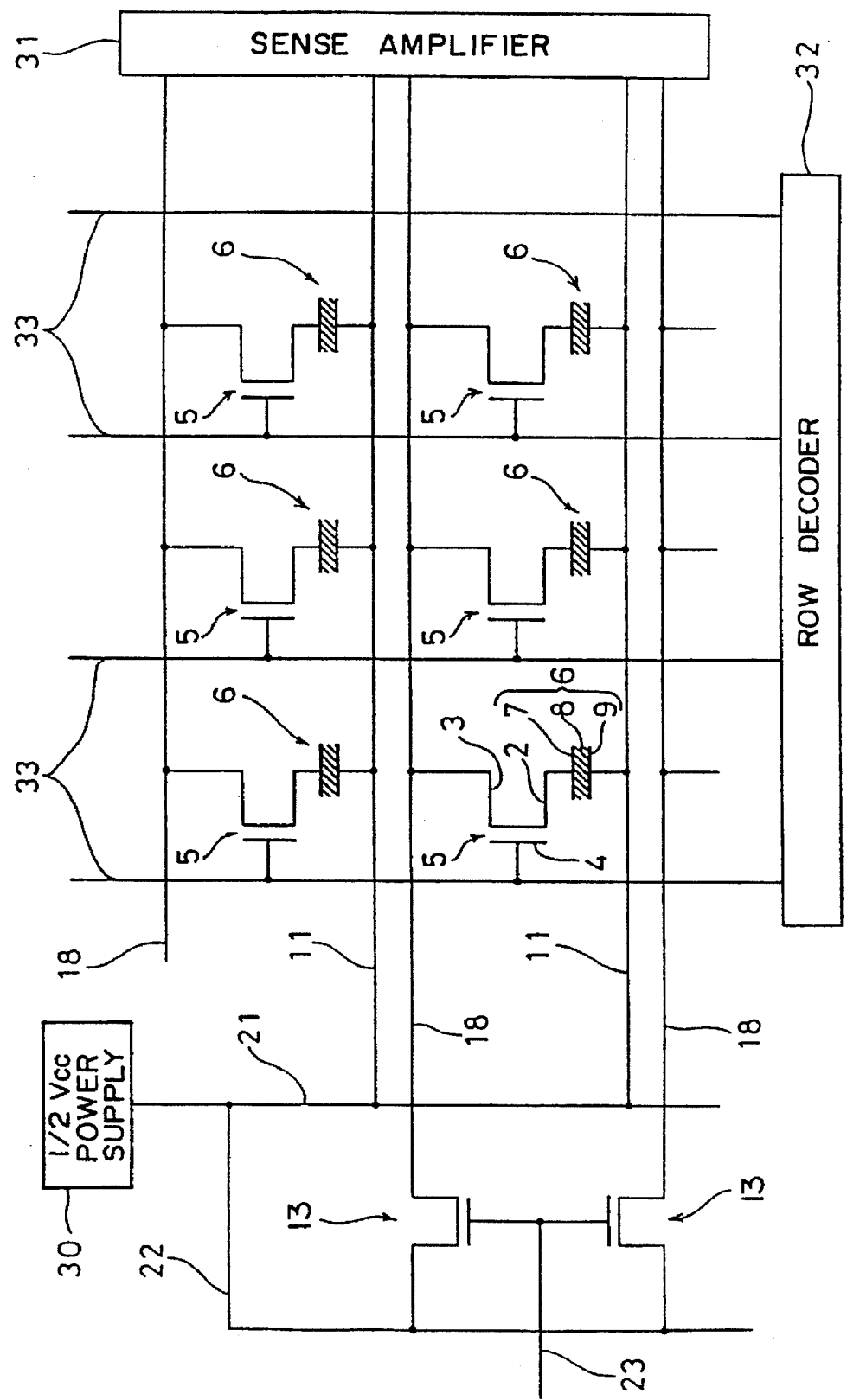
FIG. 2 is an equivalent circuit of the part of the DRAM of FIG. 1.
Figure 4A:
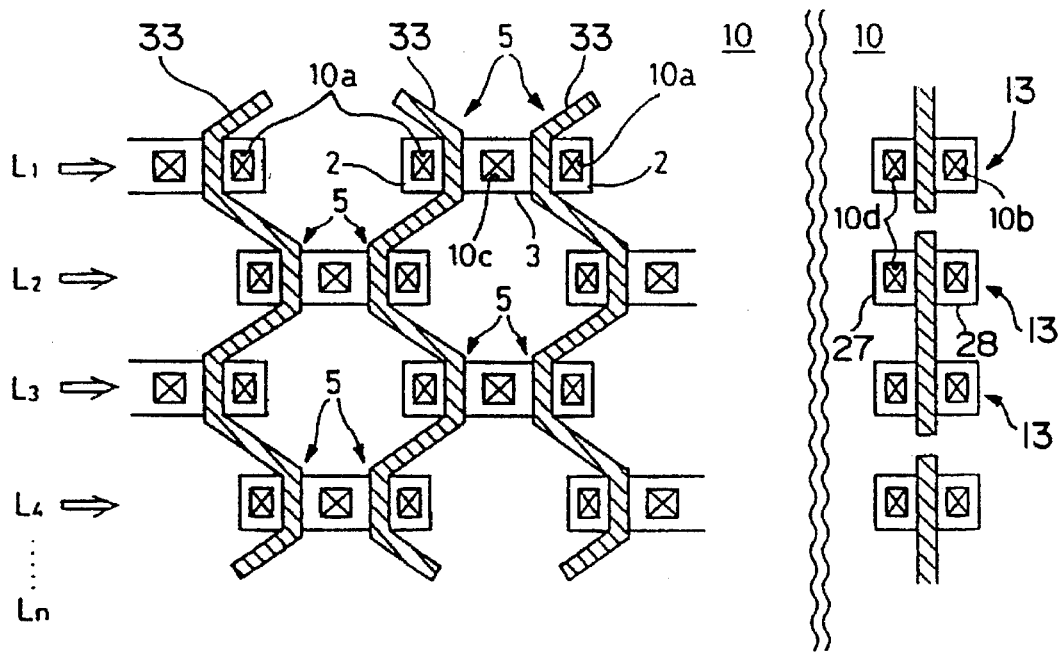
FIGS. 4A and 4B are plan views, in sequence, of the steps in the DRAM fabricating method.
Figure 4B:
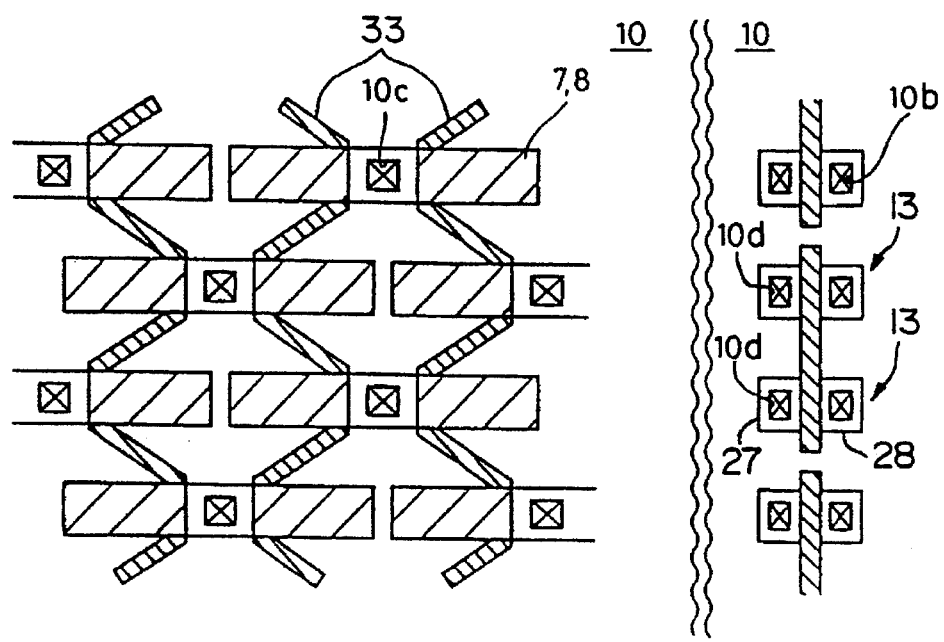

As shown in FIGS. 4A and 4B, the memory cell group including the MOS transistor group 5 and the capacitor group 6 is arranged in a matrix form in the memory cell formation region of the substrate 1. Memory cells on each of lines $L_1$ to $L_n$ in FIG. 4A are referred herein to as a column-direction memory cell group. For the purpose of realizing high density integration, memory cells on the adjacent lines are arranges as mutually shifted at their positions in the column direction. Further, the gate electrodes 4 of the transistors of the adjacent memory cells in a row direction are connected as shown in FIGS. 4A and 4B to form a gate wiring line (word line) 33. These word lines 33 are connected to a row decoder 32 as shown in FIG. 2.

In the present embodiment, since the upper electrode 9 of the capacitor 6 is also formed as embedded into the contact hole 10a, the effective area of the capacitor can be increased and correspondingly the capacitance of the capacitor can be increased. In the present embodiment, in addition, the upper electrode 9 of the capacitor 6 is formed integral with the wiring line 11 with use of the same film.

In the present embodiment, the material of the dielectric film 8 may be lead titanate, lead titanate zirconium, lead titanate zirconium lanthanum, strontium titanate, strontium titanate barium, tantalum oxide, bismuth oxide, yttrium oxide, zirconium oxide, tungsten bronze, or a mixture thereof, and desirably lead titanate having a relative dielectric constant of 50 or more. Alternatively, the dielectric film 8 may be of 3-layered structure including an oxide layer, a nitride layer and an oxide layer.

Further, the materials of the wiring line 11, bit wiring line 18, upper and lower electrodes 9 and 7 may include ruthenium dioxide film, vanadium oxide, indium oxide, or a mixture thereof, and desirably ruthenium dioxide ($RuO_2$). One or more of the materials of the wiring line 11, bit wiring line 18, upper and lower electrodes 9 and 7 may be platinum, silver, titanium or polycrystalline silicon containing an impurity.

As shown in the right side of FIG. 1, each bit wiring line 18 is connected to one impurity diffused region 27 of a corresponding transistor 18 for column selection, which is formed simultaneously with formation of the MOS transistor group 5, at a contact hole 10d made in the insulating film 10.

Sequentially formed on the wiring lines 11, 18 and upper electrode 9 are an inter-layer insulating film 14, wiring lines (word lines) 15 connected to the gate electrodes 4 through a group of contact holes (not shown) made in the insulating film, an insulating film 16, and a protective film 17.

FIG. 2 is an equivalent circuit of the DRAM of the first embodiment of the present invention. The upper electrodes 9 of the capacitors 6 of the memory cells forming coles of a memory cell array are connected to the associated wiring lines 11 wired via a wiring line 21 to a (½)Vcc voltage supply 30 (Vcc=power source voltage). The (½)Vcc voltage supply 30 is connected with the bit wiring lines 18 of column selection through a wiring line 22 and the transistors 13 for column selection, and the bit wiring lines 18 are connected to the other impurity diffused regions 3 of the MOS transistor group 5 as transfer gates of the memory cells forming the respective columns and also to a sense amplifier 31. With such an arrangement, a voltage of (½)Vcc is supplied to the upper electrodes 9 of the capacitors 6 of the respective memory cells. Each pair of gates of the transistors 13 for column selection are connected to a column decoder in a not shown region through a common wiring line 23. The gate electrodes 4 of the respective memory cells are connected to the word lines 33 as the row selection lines of the memory cell array, the word lines 33 being connected to the row decoder 32.

Explanation will then be made as to the operation of the DRAM of the present embodiment by referring to FIG. 2. First, when it is desired to write data in a memory cell, the address of the memory cell in which the data is to be written is designated by the row decoder 32 and the column decoder. This causes the column selection transistor 13 connected to the selected bit wiring line 18 to be turned ON so that the selected bit wiring line 18 is precharged to a potential of (½)Vcc. Thereafter, the column selection transistor 13 connected to the selected bit wiring lines 18 is turned OFF so that a potential of 0 (V) or Vcc is applied to the selected bit wiring lines 18 via the sense amplifier 31 according to the type ("0" or "1") of the data to be written and so that a high potential is applied to the selected word line 33 to turn ON the MOS transistor 5. As a result, in the capacitor 6 of the selected memory cell, positive or negative electric charge is accumulated in the lower electrode 7 according to the type of the data to be written. When the bit wiring line 18 is precharged to the potential of (½)Vcc in this way, even application of the potential of 0 (V) or Vcc to the bit wiring line 18 causes variation in the potential of the bit wiring line 18 to be quickly completed, whereby its write time can be shortened. Further, since the upper electrode 9 of the capacitor 6 is precharged to the potential of (½)Vcc, the intensity of electric field applied to the dielectric film 8 of the capacitor 6 can be made small (±(½)Vcc) regardless of the storage state of the capacitor 6, with the result of an improvement in the breakdown voltage of the capacitor 6.

Next, when it is desired to read out data from a specific memory cell, the address of the memory cell from which the data is to be read out is designated by the row decoder 32 and column decoder. This causes the column selection transistor 13 connected to the selected bit wiring line 18 to be turned ON so that the bit wiring line 18 is precharged to a potential of (½)Vcc. After this, the column selection transistor 13 is turned OFF so that the bit wiring line 18 is put in its floating state. Thereafter, a high potential is applied to the selected word line 33 to turn ON the transistor 5. This results in that the electric charge accumulated in the capacitor 6 of the memory cell connected to the selected word line 33 is supplied to the sense amplifier 31 via the associated bit wiring line 18 as a read signal. The sense amplifier in turn senses the read signal and discriminates the contents ("0" or "1") of the data written in the selected memory cell. Even in the read mode, since the bit wiring line 18 is precharged to the potential of (½)Vcc immediately before the reading, no application of the potential of 0 (V) or Vcc to the bit wiring line 18 causes variation in the potential of the bit wiring line 18 to be quickly completed, thus shortening the read time.

Explanation will next be made as to a method for fabricating the DRAM of FIG. 1 by referring to FIGS. 3A to 3F and also by referring to FIGS. 4A, 4B and 5 corresponding plan views of steps of FIGS. 3B, 3D and 3E respectively.

Figure 3A:
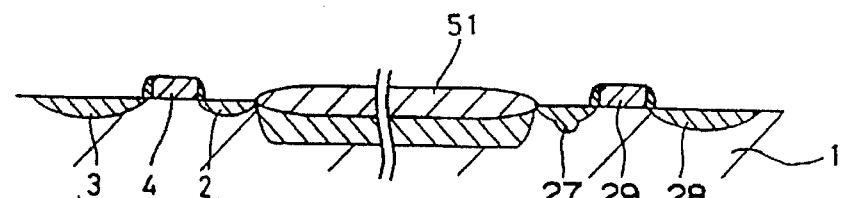
FIGS. 3A to 3F are cross-sectional views, in sequence, of steps in a method for fabricating the DRAM of FIG. 1.

First, as shown in FIG. 3A, on the silicon substrate 1 having an element separation region 51, there are formed in a left side (memory cell formation region) thereof a plurality of MOS transistors 5 of DRAM memory cells arranged in a matrix form, each of the transistors 5 having impurity diffused regions 2 and 3 and a gate electrode 4; whereas, there are formed in a right side (element formation region or peripheral circuit formation region) separated by the element separation region 51 from the memory cell formation region a group of column selection transistors 13 of a MOS structure for column selection, each of the column selection transistors 13 having impurity diffused regions 27 and 28 and a gate electrode 29, the formation of the MOS transistor groups 5 and 13 being preferably carried out at the same time. In the drawing, only one of the transistor elements included in each group is illustrated as an example. Although a gate oxide film is actually formed underneath the gate electrodes 4 and 29, it is omitted in the drawing.

Figure 3B:
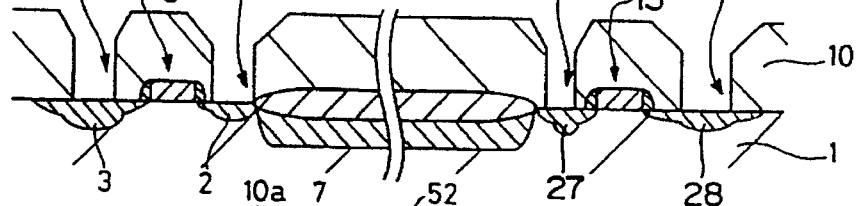

As shown in FIG. 3B, a BPSG film 10 is formed on the semiconductor substrate 1 all thereover. In order to flatten the BPSG film, the BPSG film is subjected to a reflowing operation at a temperature of above 700° C. Thereafter, made in the insulating film 10 are contact holes 10a and 10c which reach the impurity diffused regions 2 and 3 of the transistor 5 as well as contact holes 10d and 10b which reach impurity diffused regions 27 and 28 of the column selection transistor 13, respectively. N type impurity such as phosphorus, is ion implanted into the silicon substrate 1 through these contact holes 10a to 10d, after which the resultant substrate is subjected to an annealing operation at a temperature of, e.g., 800°–900° C. to activate the impurity. The making of the contact holes 10a to 10d in the BPSG film 10 is carried out by covering the BPSG film 10 other than the hole-making regions with resist film or the like, by subjecting the substrate to an isotropic wet etching operation and then to an anisotropic dry etching operation.

Shown in FIG. 4A is a plan view of a resultant substrate after being subjected to the above operations, in which the contact hole 10c is made for interconnection between the impurity diffused region 3 of the transistor 5 and the bit wiring line 18, while the contact hole 10b is made for interconnection between the impurity diffused region 29 of the column selection transistor 13 and the wiring line 22.

Figure 3C:
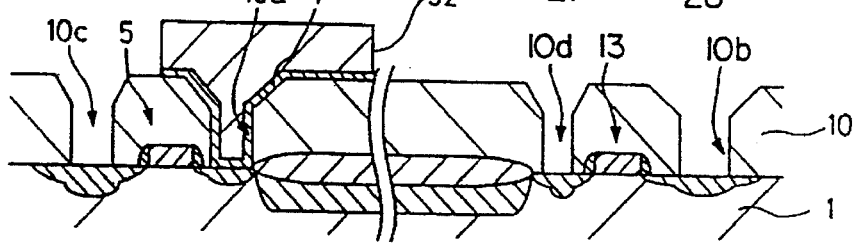

As shown in FIG. 3C, next, the semiconductor substrate 1 is subjected to a sputtering process to form a ruthenium dioxide film all over the substrate, subjected to a fine etching operation with use of a photoresist 52 to selectively etch the ruthenium dioxide film and to form a lower electrode 7 of the capacitor 6 connected to the impurity diffused region 2 at the contact hole 10a. At this time, the lower electrode 7 is formed to have a substantially constant film thickness along the inner side of the contact hole 10a.

Figure 3D:
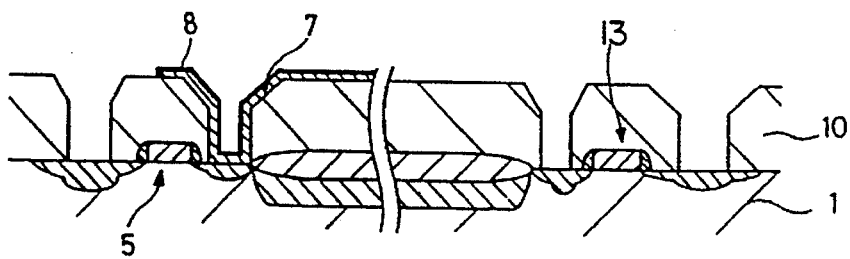

As shown in FIG. 3D, the resultant substrate is subjected to a removal of the photoresist 52 and then subjected to a sputtering process to form a dielectric film 8 containing lead titanate on the lower electrode 7. In this case, the dielectric film 8 is formed to have a substantially constant film thickness along the inner side of the contact hole 10a. Thereafter, the resultant substrate is subjected to a selective removing operation with use of a mask to selectively remove the dielectric film 8 and to leave only an area of the dielectric film 8 corresponding to a nearly top area of the lower electrode 7.

Shown in FIG. 4B is a plan view of a resultant substrate after subjected to the above operations. Even in FIG. 4B, the lower electrode 7 of the capacitor 6 is illustrated as having substantially the same shape as the dielectric film 8.

Figure 3E:
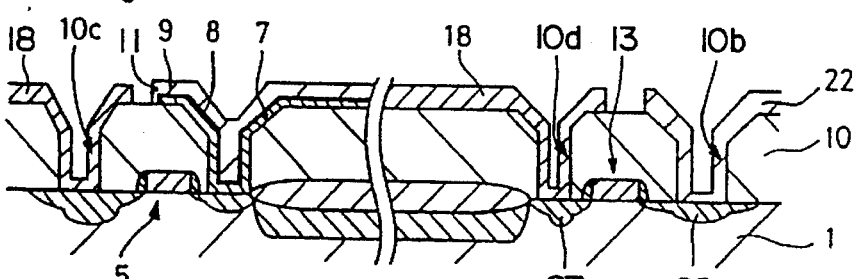

As shown in FIG. 3E, then, the mask used during the above selective etching operation of the dielectric film 8 is removed from the resultant substrate. After this, the substrate is subjected to a sputtering process all over the semiconductor substrate 1 including the column selection transistor 13 part on the right side and the contact hole 10c part on the left side to form a ruthenium dioxide film, and then is subjected, on the ruthenium dioxide film, to a fine patterning operation to form an upper electrode 9 opposed to the lower electrode 7 with the dielectric film 8 disposed therebetween, a wiring line 11, and a bit wiring line 18 connected to the impurity diffused region 3 of the MOS transistor 5 at the contact hole 10c and also connected to one impurity diffused region 27 of the transistor 13 at the contact hole 10c. Simultaneously with the above formation, a wiring line 22 connected to the other impurity diffused region 28 of the transistor 13 is also formed. Thus, the upper electrode 9 of the capacitor 6 and the wiring lines 11, 18 and 22 are formed at the same time. A vertical cross-sectional view of FIG. 3E is taken along a line A—A' in FIG. 5.

Figure 5:
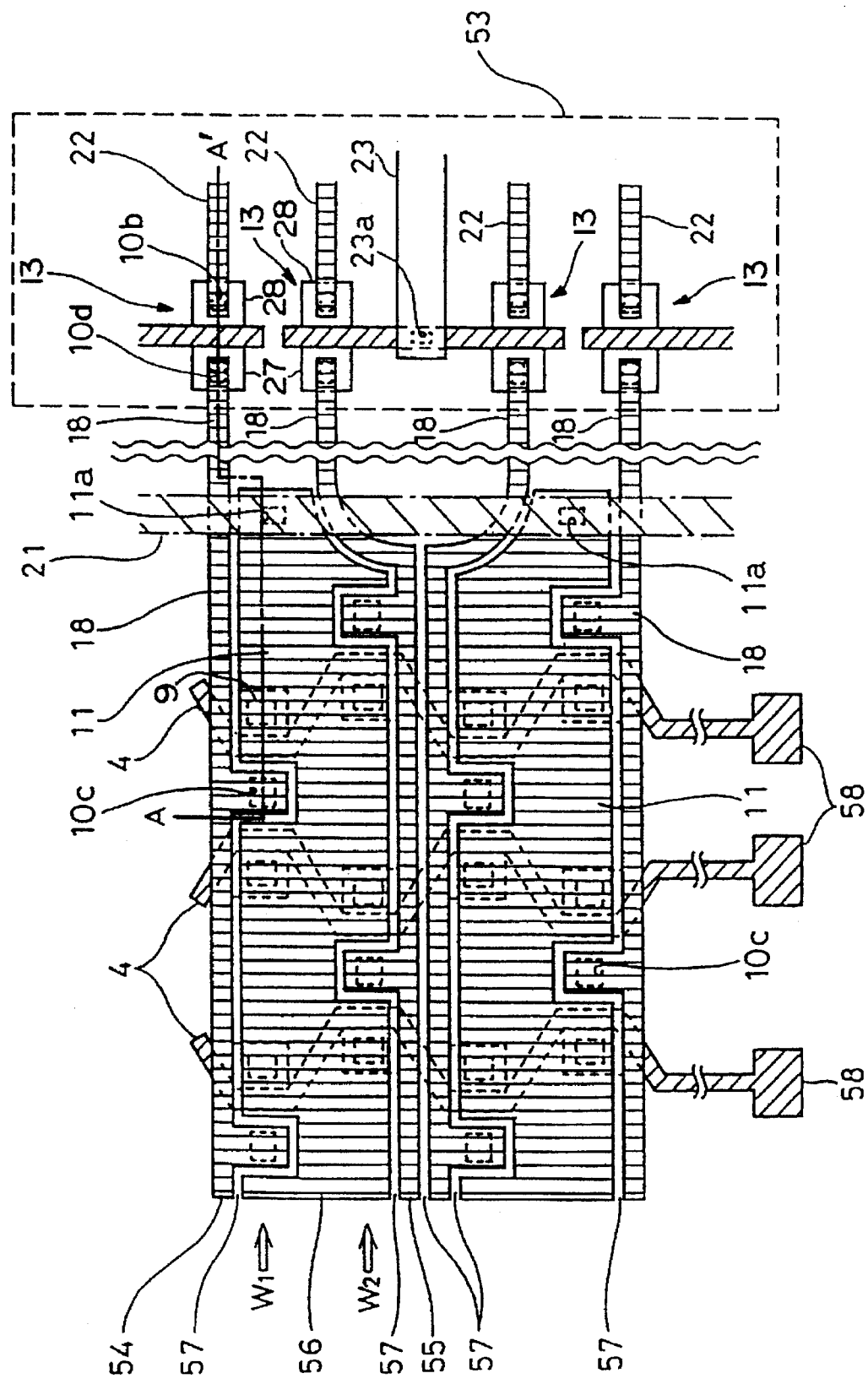
FIG. 5 is a plan view showing one of the steps in the DRAM fabricating method.

FIG. 5 shows a plan view of a semiconductor device in this step. As will also be clear from FIG. 5, the impurity diffused regions 3 of the transistors 5 are connected to bit wiring lines 18 at the contact holes 10c, and the bit wiring lines 18 are connected to impurity diffused regions 27 of the column selection transistors 13 through the contact holes 10d. The other impurity diffused regions 28 of the column selection transistors 13 are connected to the wiring lines 22 through the contact holes 10b. The gate electrodes 29 of one pair of column selection transistors 13 are commonly connected to the common wiring line 23 at the contact hole 23a made in the inter-layer insulating film 14 above the gate electrodes.

In adjacent two column-direction memory cell groups arranged in adjacent two lines (e.g., adjacent two lines $W_1$ and $W_2$ in FIG. 5), the upper electrodes 9 and wiring lines 11 of the capacitors of the two column-direction memory cell groups are formed in an electrically conductive identical region 56. In other words, the two column-directional memory cell groups share the single conductive region. Bit connection regions 54 and 55 are formed on the same insulating film 10 electrically separated by an insulating region 57 with the conductive region 56 disposed therebetween. The wiring lines 11 integrally formed with the upper electrodes 9 of the capacitors 6 are connected to the wiring line 21 connected to the (½)Vcc voltage supply 30 at contact holes 11a made in the insulating film 14 provided thereabove.

Figure 3F:
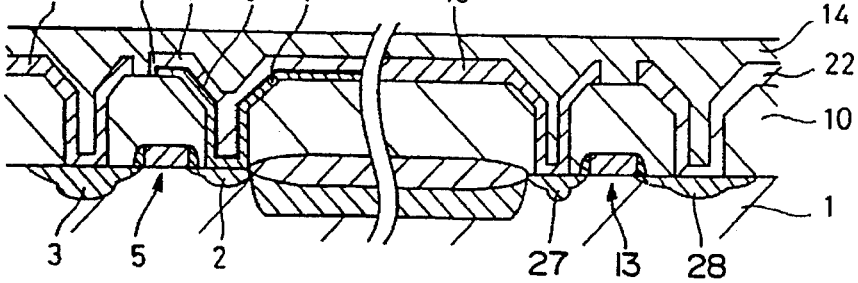

Next, as shown in FIG. 3F, an inter-layer insulating film 14 including a BPSG film or PSG film is formed all over the semiconductor substrate 1. Thereafter, a group of gate lines 15, an insulating film 16 and a protective film 17 are sequentially formed on the inter-layer insulating film 14, at which state a DRAM memory cell as shown in FIG. 1 is fabricated. The gate wiring lines are connected to ends 58 of the wiring lines of the gate electrodes 4 in FIG. 5 through contact holes (not shown) made in the inter-layer insulating film 14.

(Second Embodiment)

Figure 6:
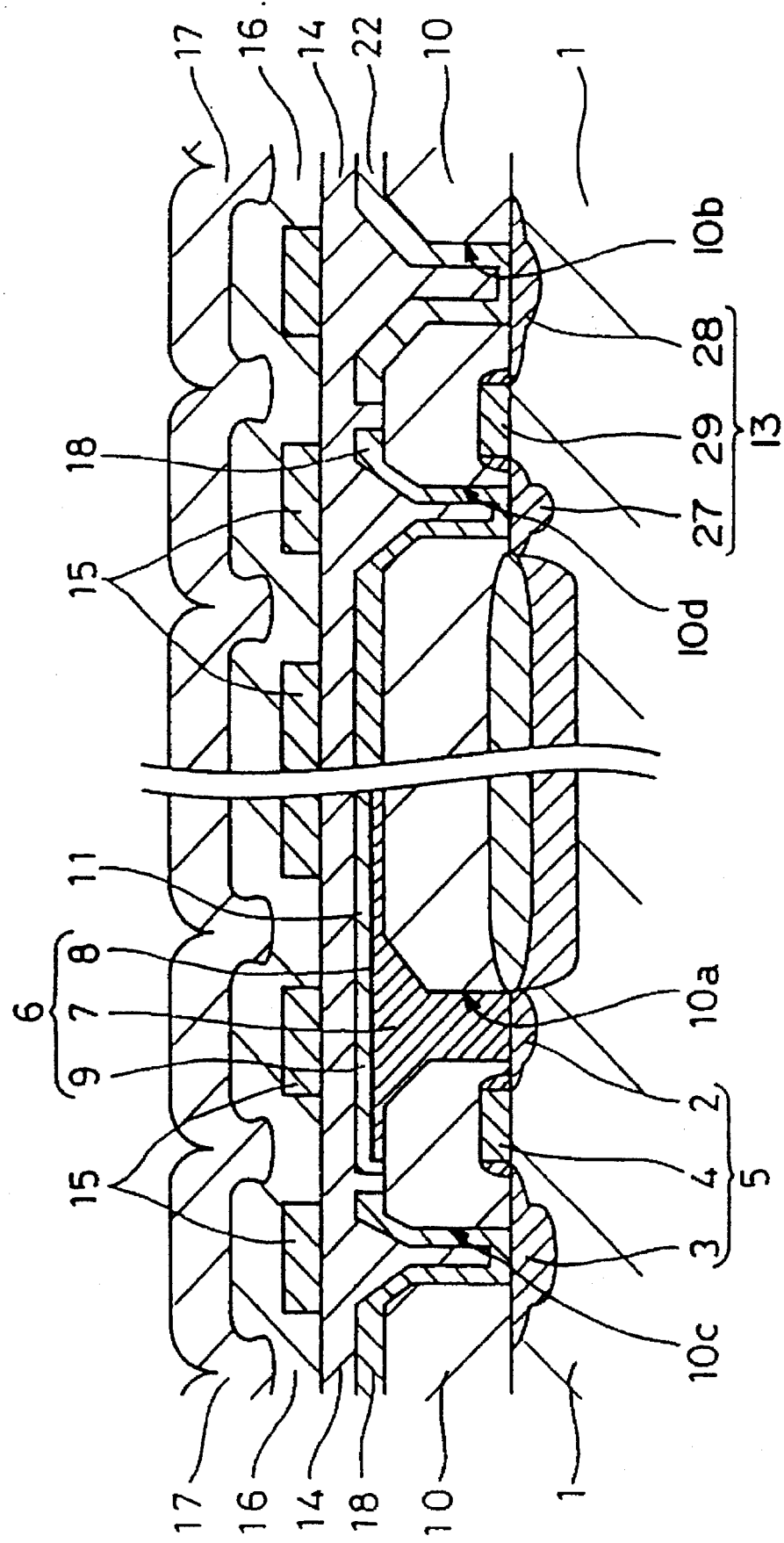
FIG. 6 is a cross-sectional view of a part of a DRAM in accordance with a second embodiment of the present invention.

A semiconductor device in accordance with a second embodiment of the present invention will be explained with reference to FIG. 6. In the semiconductor device shown in FIG. 6, a lower electrode 7 of a capacitor 6 is formed as substantially embedded into the a contact hole 10a, whereby the flatness of the dielectric film 8 and upper electrode 9 is improved over that of the semiconductor device of FIG. 1. Other arrangement is substantially the same as that of the semiconductor device of FIG. 1. In FIG. 6, members having the same functions as those in FIG. 1 are denoted by the same reference numerals.

FIG. 6 is a partial cross-sectional view of the semiconductor device, in which a left side of the drawing denotes a DRAM memory cell part and a right side thereof denotes a transistor part for addressing (column selection) of memory cells.

As shown in the left side of FIG. 6, each capacitor in a group of stack type capacitors 6 includes a lower electrode 7, a dielectric film 8, and an upper electrode 9 opposite to the lower electrode 7 with the dielectric film 8 disposed therebetween. The lower electrode 7 of each of the capacitors 6 is connected to the impurity diffused region 2 of the corresponding MOS transistor 5 through a contact hole 10a made in the insulating film 10 on the impurity diffused region 2. In the present embodiment, the lower electrode 7 of the capacitor 6 is formed as substantially completely embedded into the contact hole 10a, so that the dielectric film 8 and upper electrode 9 are formed substantially flat. As a result, a break (electrically improper conduction in the steps) in the upper electrode 9 and in steps of the wiring line 11 made of the same film as the upper electrode 9 to be integral therewith can be substantially completely prevented, thus improving its wiring reliability.

As shown in the right side of FIG. 6, the bit wiring line 18 is connected to one impurity diffused region 27 of the column selection transistor 13 through the contact hole 10d made in the BPSG film 10. The wiring line 22 is connected to the other gate electrode 28 of the column selection transistor 13 through the contact hole 10b made in the insulating film 10. Further, the inter-layer insulating film 14, word line 15, insulating film 16 and protective film 17 are sequentially formed on the wiring lines 11, 18, 22, and upper electrode 9.

The present embodiment is substantially the same as the first embodiment regarding the materials of the dielectric film 8, wiring lines 11, 18, upper electrode 9, and lower electrode 7 and so on. The fabricating method is also substantially the same as that in the first embodiment.

(Third Embodiment)

Explanation will then be made as to a third embodiment of the present invention with reference to FIGS. 7A to 7F and FIG. 8. Reference will be made also to FIGS. 4A, 4B and 5 used in the explanation of the first embodiment. FIGS. 7A to 7F are cross-sectional views, in sequence, of steps in a method for fabricating a semiconductor device in accordance with a third embodiment of the present invention. First of all, as shown in FIG. 7A, on the silicon substrate 1 having an element separation region 51, there are formed in a left side (memory cell formation region) thereof a plurality of MOS transistors 5 of DRAM memory cells arranged in a matrix form, each of the transistors 5 having impurity diffused regions 2 and 3 and a gate electrode 4; whereas, there are formed in a right side (peripheral circuit formation region) a group of column selection transistors 13 of a MOS structure for column selection, each of the column selection transistors 13 having impurity diffused regions 27 and 28 and a gate electrode 29, the formation of the MOS transistor groups 5 and 13 being preferably carried out at the same time. In the drawing, only one of the transistor elements included in each group is illustrated as an example. Although a gate oxide film is actually formed underneath the gate electrodes 4 and 29, it is omitted in the drawing. As to the materials, they may be the same as those in the first embodiment.

Then, as shown in FIG. 7B, a BPSG film 10 is formed all over on the semiconductor substrate 1. In order to flatten the BPSG film, the BPSG film of the semiconductor substrate 1 is subjected to a reflowing operation at a temperature of above 700° C. Thereafter, made in the BPSG film 10 are contact holes 10a and 10c which reach the impurity diffused regions 2 and 3 of the MOS transistor 5 as well as contact holes 10d and 10b which reach impurity diffused regions 27 and 28 of the column selection transistor 13, respectively. Such N type impurity such as phosphorus is ion implanted into the silicon substrate 1 through these contact holes 10a to 10d, after which the resultant substrate is subjected to an annealing operation at a temperature of, e.g., 800°–900° C. to activate the impurity. Making of the contact holes 10a to 10d in the BPSG film 10 is carried out by covering the BPSG film 10 other than the hole-making regions with resist film or the like, by subjecting the substrate to an isotropic wet etching operation and then to an anisotropic dry etching operation.

Shown in FIG. 4A is a plan view of a resultant substrate after being subjected to the above operations, in which the contact hole 10c for each MOS transistor is made for interconnection between the impurity diffused region 3 of the transistor 5 and the bit wiring line 18, while the contact hole 10b is made for interconnection between the impurity diffused region 28 of the column selection transistor 13 and the wiring line 22.

As shown in FIG. 7C, next, the semiconductor substrate 1 is subjected to a sputtering process to form a ruthenium dioxide film all over the substrate and, subjected to a fine etching operation to selectively etch the ruthenium dioxide film and to form a lower electrode 7 connected to the impurity diffused regions 2, 3, 28 and 27 at the contact holes 10a, 10b, 10c and 10d respectively. At this time, the first lower electrode 7 is formed to have a substantially constant film thickness along the inner sides of the contact holes 10a, 10b, 10c and 10d. Thereafter, the resultant substrate is subjected to a fine patterning operation of the photo-lithographical technique to remove the first ruthenium dioxide film 7 on the column selection transistor 13. As a result, the ruthenium dioxide film 7 remains as a pattern of the bit wiring lines 18a and 22 as shown as enclosed by a dotted line in FIG. 5.

As shown in FIG. 7D, the resultant substrate is subjected to a sputtering process to form a dielectric film 8 containing lead titanate on the first ruthenium dioxide film 7. In this case, the dielectric film 8 is formed to have a substantially constant film thickness along the inner side of the contact hole 10a. Thereafter, the photoresist 52 is selectively formed as a suitable mask in the vicinity of the region of the contact hole 10a reaching one impurity diffused region 2 of each of the transistors 5, and the dielectric film 8 other than the vicinity of the region of the contact hole 10a is subjected to a selective removing operation with the photoresist 52 as the mask. As a result, the dielectric film 8 formed to the contact holes 10b, 10c and 10d can be completely removed.

As shown in FIG. 7E, then, after the photo-resist 52 is removed, the semiconductor substrate 1 is subjected to a sputtering process over all surface including the column selection transistor 13 part on the right side and the contact hole 10c part on the left side to form a second ruthenium dioxide film 9, and the substrate is then subjected to a fine patterning operation. Consequently, there are formed a wiring line 11 and a second ruthenium dioxide film 9 of an upper electrode opposite to the first ruthenium dioxide film 7 of a lower electrode with the dielectric film 8 disposed therebetween, a first ruthenium dioxide film 7 as well as a second ruthenium dioxide film 9 on the first ruthenium dioxide film 7, which films are connected to one impurity diffused region 3 of each transistor 5 and also connected to the impurity diffused region 27 of the corresponding transistor 13 through the contact holes 10c and 10d to be used as the bit wiring line 18 extended on the BPSG film 10, and a first ruthenium dioxide film 7 as well as a second ruthenium dioxide film 9 formed on the first ruthenium dioxide film 7, which films are connected to the other impurity diffused region 28 of the transistor 13 to be used as the wiring line 22, respectively. Thus, the upper electrode group 9 of the capacitors 6 and the wiring line group 11, 18 and 22 are formed at the same time. A vertical cross-sectional view of FIG. 7E is taken along a line A—A' in FIG. 5.

FIG. 5 shows a plan view of a semiconductor device in this step. As will also be clear from FIGS. 1 and 5, the impurity diffused regions 3 of the transistors 5 are connected to bit wiring lines 18 at the contact holes 10c, and the bit wiring lines 18 are connected to the impurity diffused regions 27 of the column selection transistors 13 through the contact holes 10d. In adjacent two column-direction memory cell groups arranged in adjacent two lines (e.g., adjacent two lines $W_1$ and $W_2$ in FIG. 5), the upper electrodes 9 and wiring lines 11 of the capacitors of the two column-direction memory cell groups and their wiring lines 11 are formed in the electrically conductive identical region 56. In other words, the two column-directional memory cell groups share the single conductive region. Bit connection regions 54 and 55 are formed on the same insulating film 14 as electrically separated by an insulating region 57 with the conductive region 56 disposed therebetween. Further, the other impurity diffused regions 28 of the column selection transistors 13 are connected to the wiring lines 22 at the contact holes 10b. The gate electrodes of one pair of column selection transistors 13 are commonly connected to the common wiring line 23 at the contact hole 23a made in the insulating film 14 provided thereabove. The wiring lines 11 integrally formed with the upper electrodes 9 of the capacitors 6 are connected to the wiring line 21 connected to the (½)Vcc voltage supply 30 through contact holes 11a made in the insulating film 14 provided above.

Figure 8:
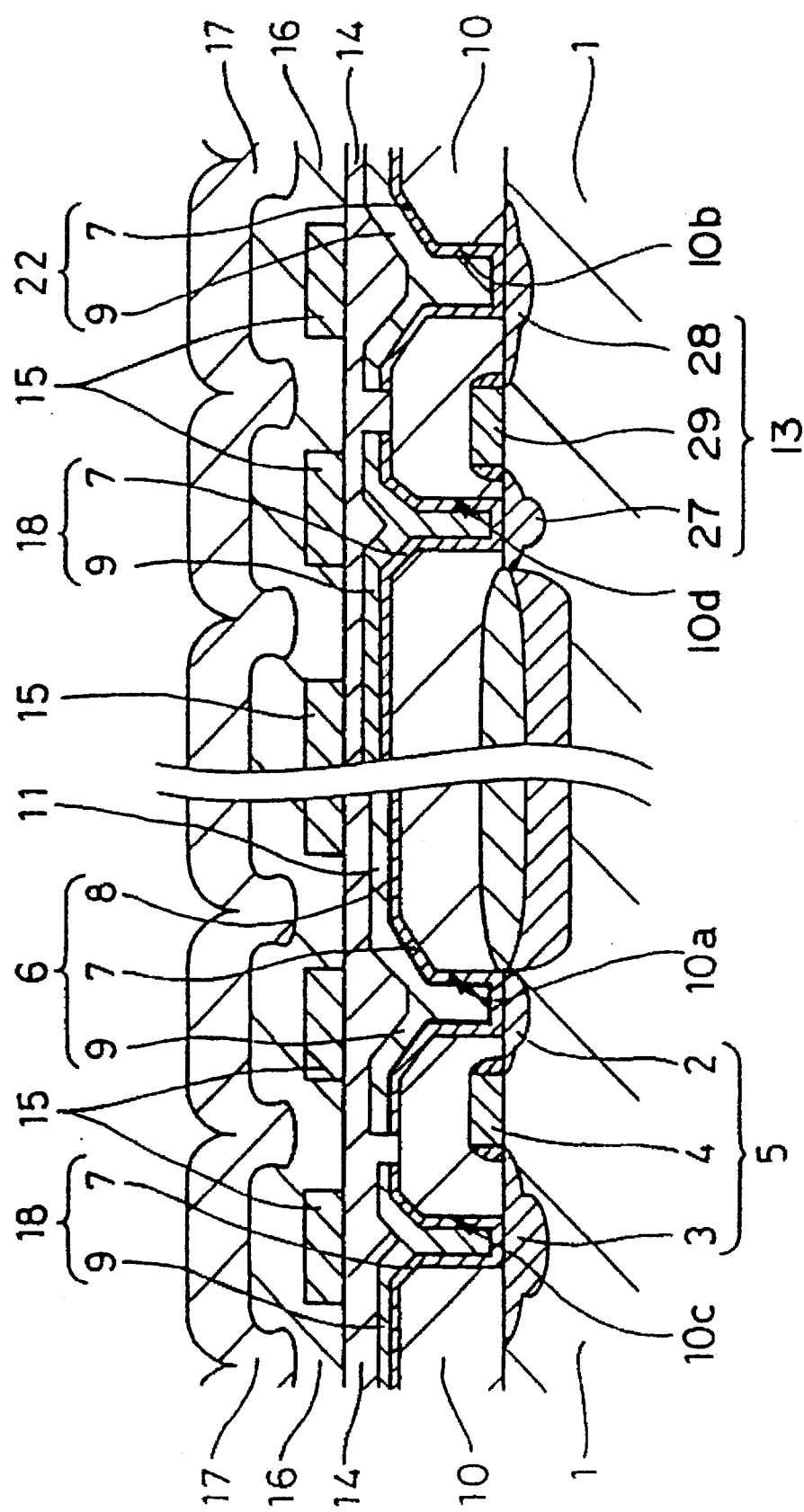
FIG. 8 is a cross-sectional view of a part of a DRAM in accordance with a third embodiment of the present invention.

Next, as shown in FIG. 7F, an inter-layer insulating film 14 including a BPSG film or PSG film is formed all over the resultant substrate. Thereafter, a group of gate lines 15, an insulating film 16 and a protective film 17 are sequentially formed on the inter-layer insulating film 14, at which state such a DRAM memory cell as shown in FIG. 8 is fabricated. The gate wiring lines 15 are connected to ends 58 of the wiring lines of the gate electrodes 4 in FIG. 5 through contact holes (not shown) made in the inter-layer insulating film 14.

Although the first ruthenium dioxide film 7 has been used for pattern formation of the wiring lines 18 and 22 in the step of FIG. 7C, the first ruthenium dioxide film of the parts of the wiring lines 18 and 22 may be formed collectively in the step of FIG. 7E.

In the foregoing first to third embodiments, the upper electrode group 9 and wiring lines 11 of the capacitors in a plurality of groups of capacitors 6 are formed integrally with the electrically conductive identical film, and the bit wiring lines 18 are formed on the same plane as the capacitor electrode group 9 extended on the wiring line 11 and their wiring line group 11. As a result, the number of steps in a process for forming the wiring lines in the semiconductor device fabrication method can be reduced.

Since the upper electrodes 9 of the capacitors 6 of memory cells arranged on the column lines of the memory cell array as well as the wiring lines 11 are integrally formed, it becomes unnecessary for the electrodes 9 and wiring lines 11 to have a contact structure therebetween. Accordingly, the thickness of the insulating film 10 can be reduced by an amount corresponding to the contact structure when compared with that of the prior art, whereby the wiring lines 11 can be formed at a position lower than that in the prior art. As a result, since the aspect ratio of the contact hole 10d for interconnection between the bit wiring lines 18 formed at the same height as the wiring lines 11 and the impurity diffused regions 27 of the column selection transistors 13 can be made small, the coverage of the wiring lines 11 at the contact holes 10d can be improved with the reliable wiring connection.

Further, annealing processes at high temperatures of above 700° C. including the reflowing of the insulating film 10 such as the BPSG film and the activation process based on contact implantation through the contact holes 10a and 10b can be carried out prior to the formation of the capacitors 6. Thus, a dielectric material such as lead titanate having a high dielectric constant of 50 or more can be employed as the dielectric film 8 of the capacitor 6. Further, even when electrically conductive oxide such as ruthenium dioxide film is used as the material of the electrodes of the capacitors 6, no interdiffusion can take place between the dielectric film 8 and the upper and lower electrodes 9 and 7, between the lower electrode 7 and the semiconductor substrate 1, and between the bit wiring line 18 made of the same material as the upper electrode 9 and the semiconductor substrate 1. Thus, when such material is used, the capacitance of the capacitor 6 can be increased, which leads to the fact that there can be formed DRAM memory cells which can secure the intended total capacitance of the capacitors and can be made finer than the prior art.

(Fourth Embodiment)

Figure 9:
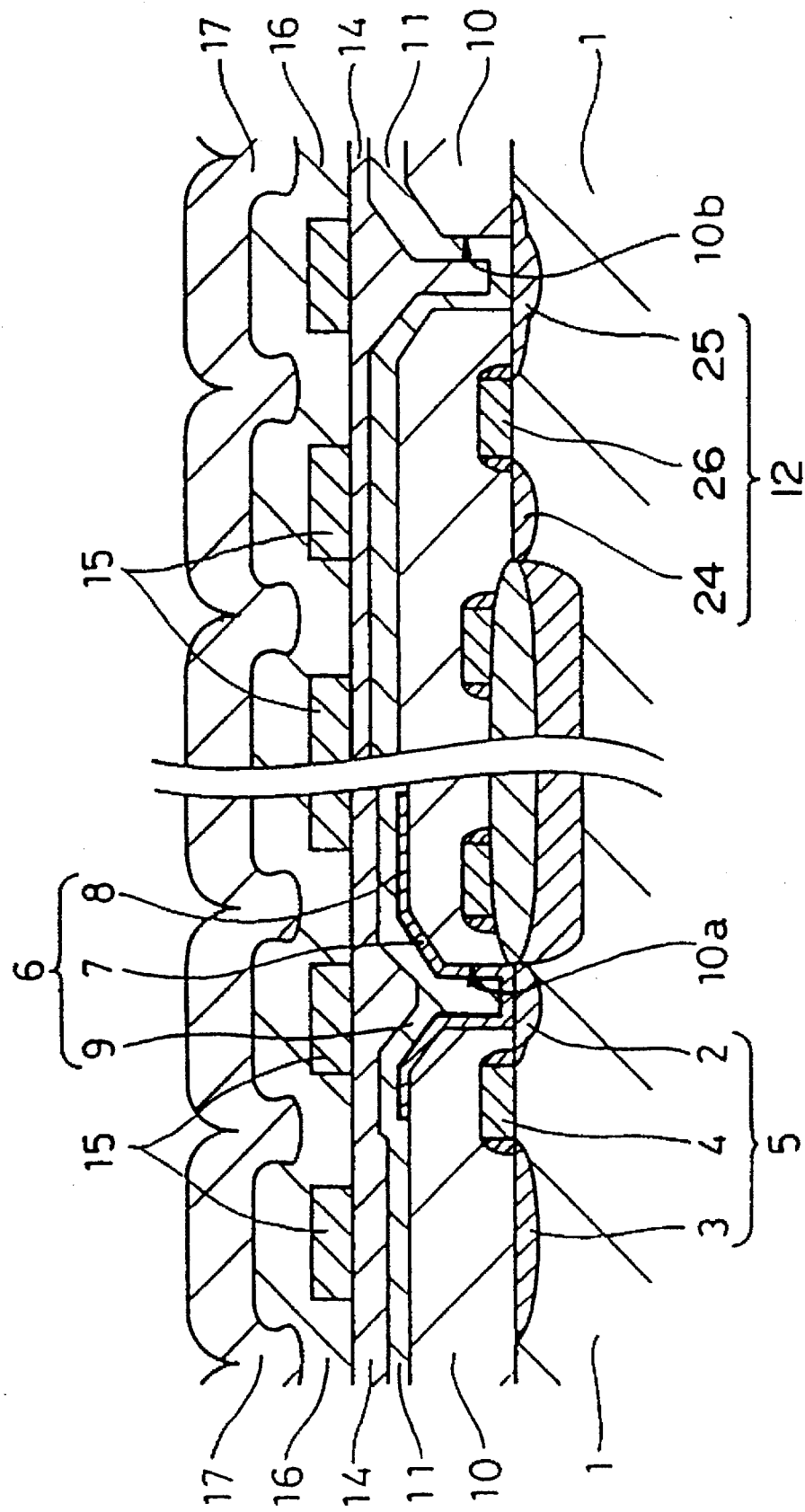
FIG. 9 is a cross-sectional view of a part of a DRAM in accordance with a fourth embodiment of the present invention.

Shown in FIG. 9 is a partial cross-sectional view of a DRAM in accordance with a fourth embodiment of the present invention, in which a left side of the drawing represents a DRAM memory cell part and a right side thereof represents a transistor part for addressing (for row selection) of memory cells.

In the present embodiment, as shown in the right side of FIG. 9, the wiring line 11 is connected through the contact hole 10b made in the BPSG film 10 to one impurity diffused region 25 of corresponding one of the transistors 12 for row selection formed simultaneously with formation of the MOS transistor group 5 (each transistor 12 for row selection including a gate electrode 26 and impurity diffused regions 24 and 25). Sequentially formed on the wiring line 11 and upper electrode 9 are an inter-layer insulating film 14, gate wiring lines (word lines) 15 connected to a group of gate electrodes 4 through a group of contact holes (not shown) made in the insulating film, an insulating film 16, and a protective film 17. Other arrangement is substantially the same as that of the DRAM of FIG. 1.

Figure 10:
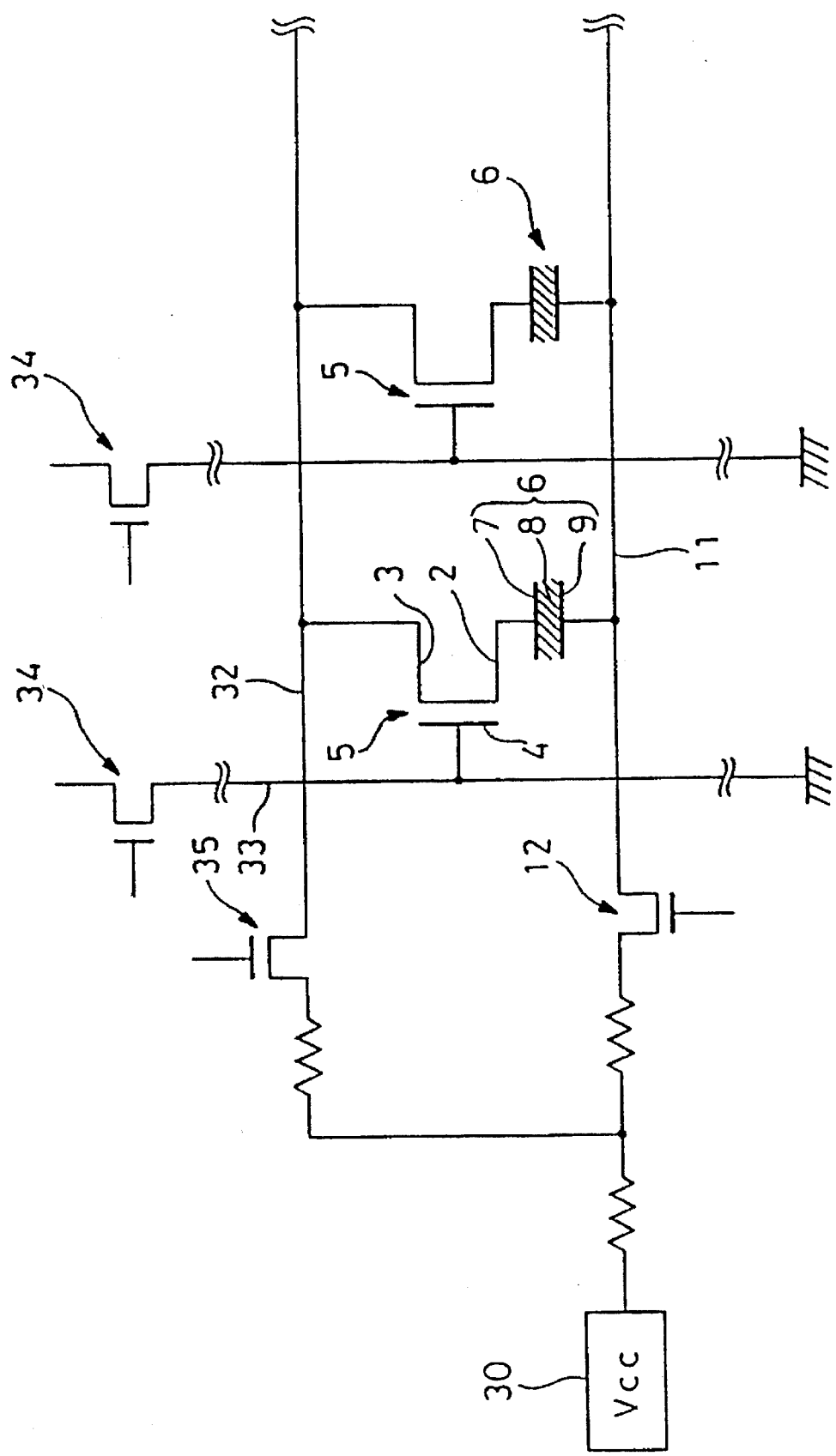
FIG. 10 is an equivalent circuit of the part of the DRAM of FIG. 9.

FIG. 10 is an equivalent circuit of the DRAM of the fourth embodiment of the present invention. The upper electrodes 9 of the capacitors 6 of the memory cells forming a column line of a memory cell array are connected to the associated row-selection wiring lines 11 wired via the row-selection transistor 12 to a Vcc voltage supply 30 (Vcc=power source voltage). The Vcc voltage supply 30 is connected with a bit wiring line 32 of row selection forming a pair with the wiring line 11, through a transistor 35 of row selection forming a pair with the transistor 12, and the bit wiring line 32 is connected to the other impurity diffused regions 3 of the MOS transistors 5 as transfer gates of the memory cells forming the respective rows. With such an arrangement, a voltage of (½)Vcc is supplied to the upper electrodes 9 of the capacitors 6 of the respective memory cells. The gate electrodes 4 of the memory cells are connected to the word lines 33 as row selection lines of the memory cell array, the word lines 33 being connected to transistors 34 of column selection.

Explanation will then be made as to the operation of the DRAM of FIG. 9 by referring to FIGS. 11A to 11F.

Figure 11A:
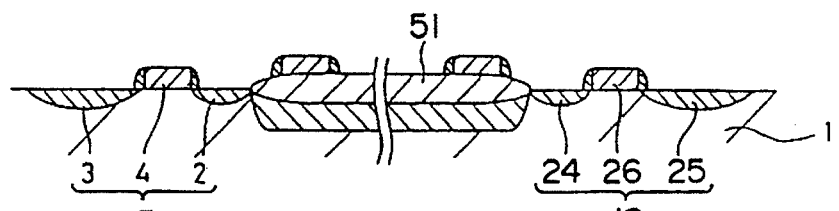
FIGS. 11A to 11F are cross-sectional views, in sequence, of steps in a method for fabricating the DRAM of FIG. 9.

First, as shown in FIG. 11A, on the silicon substrate 1 having an element separation region 51, there are formed in a left side (memory cell formation region) thereof a plurality of MOS transistors 5 of DRAM memory cells arranged in a matrix form, each of the transistors 5 having impurity diffused regions 2 and 3 and a gate electrode 4; whereas, there are formed in a right side (element formation region or peripheral circuit formation region) separated by the element separation region 51 from the memory cell formation region a group of column selection transistors 12 of a MOS structure for row selection, each of the row selection transistors 12 having impurity diffused regions 24 and 25 and a gate electrode 26, the formation of the MOS transistor groups 5 and 12 being carried out desirably at the same time. In the drawing, only one of the transistor elements included in each group is illustrated as an example. Although a gate oxide film is actually formed underneath the gate electrodes 4 and 29, it is omitted in the drawing.

Figure 11B:
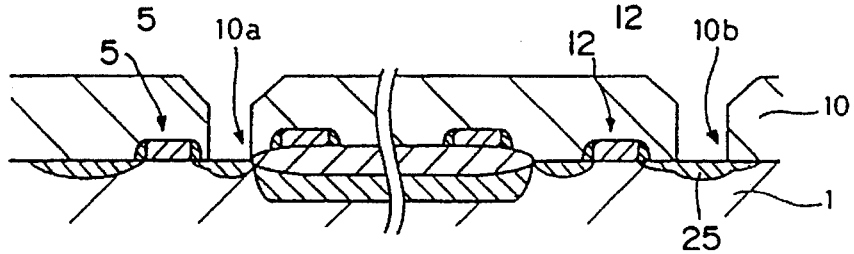

Then as shown in FIG. 11B, a BPSG film 10 is formed on the semiconductor substrate 1 all over the substrate and in order to flatten the BPSG film, the BPSG film of the semiconductor device is subjected to a reflowing operation at a temperature of above 700° C. Thereafter, made in the BPSG film 10 are contact holes 10a and 10b which reach the impurity diffused region 2 of the MOS transistor 5 and also reach the impurity diffused regions 25 of the row-selection transistor 12 respectively. Such N type impurity such as phosphorus is ion implanted into the silicon substrate 1 through these contact holes 10a to 10b, after which the resultant substrate is subjected to an annealing operation at a temperature of, e.g., 800°–900° C. to activate the impurity. The making of the contact holes 10a to 10b in the BPSG film 10 is carried out by covering the BPSG film 10 other than the hole-making regions with resist film or the like, by subjecting the substrate to an isotropic wet etching operation and then to an anisotropic dry etching operation.

Figure 11C:
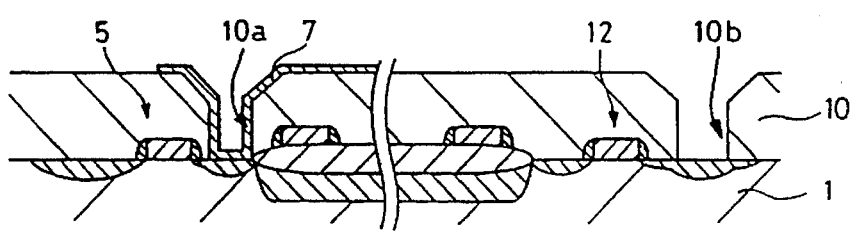

As shown in FIG. 11C, next, under the condition that the row-selection transistor group 12 on the right side is covered with a suitable mask (not shown), the semiconductor substrate 1 is subjected to a sputtering process to form a ruthenium dioxide film all over the substrate, subjected to a fine etching operation with use of a photoresist to selectively etch the ruthenium dioxide film and to form a lower electrode 7 of the capacitor 6 connected to the impurity diffused region 2 at the contact hole 10a. At this time, the lower electrode 7 is formed to have a substantially constant film thickness along the inner side of the contact hole 10a.

Figure 11D:
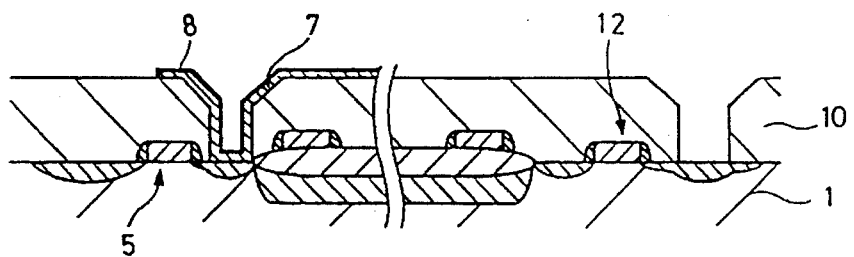

As shown in FIG. 11D, the resultant substrate is subjected to a removal of the photoresist and then subjected to a sputtering process to form a dielectric film 8 containing lead titanate on the lower electrode 7. In this case, the dielectric film 8 is formed to have a substantially constant film thickness along the inner side of the contact hole 10a. Thereafter, the resultant substrate is subjected to a selective removing operation with use of a mask to selectively remove the dielectric film 8 and to leave only an area of the dielectric film 8 corresponding to a nearly top area of the lower electrode 7.

Figure 11E:
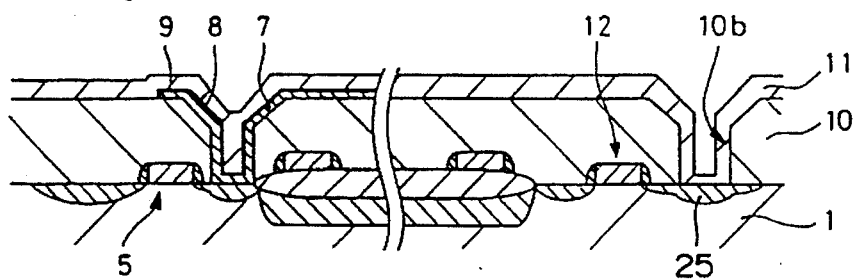

As shown in FIG. 11E, then, the mask used during the above selective etching operation of the dielectric film 8 is removed from the resultant substrate. After this, the substrate is subjected to a sputtering process all over the semiconductor substrate 1 including the row selection transistor 12 part on the right side to form a ruthenium dioxide film, and then subjected on the ruthenium dioxide film to a fine patterning operation to form an electrically conductive film having an upper electrode 9 opposite to the lower electrode 7 with the dielectric film 8 disposed therebetween and a wiring line 11 connected to one impurity diffused region 25 of the transistor 12 at the contact hole 10b. Thus, the upper electrode 9 of the capacitor 6 and the wiring lines 11 are formed at the same time.

Figure 11F:
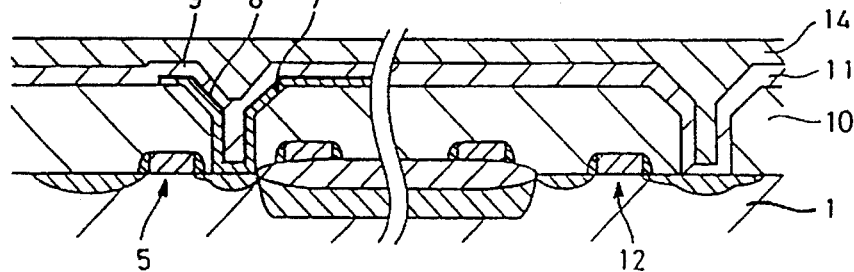

Next, as shown in FIG. 11F, an inter-layer insulating film 14 including a BPSG film or PSG film is formed all over the semiconductor substrate 1. Thereafter, a group of gate lines 15, an insulating film 16 and a protective film 17 are sequentially formed on the inter-layer insulating film 14, at which state such a DRAM memory cell as shown in FIG. 9 is fabricated.

(Fifth Embodiment)

Figure 12:
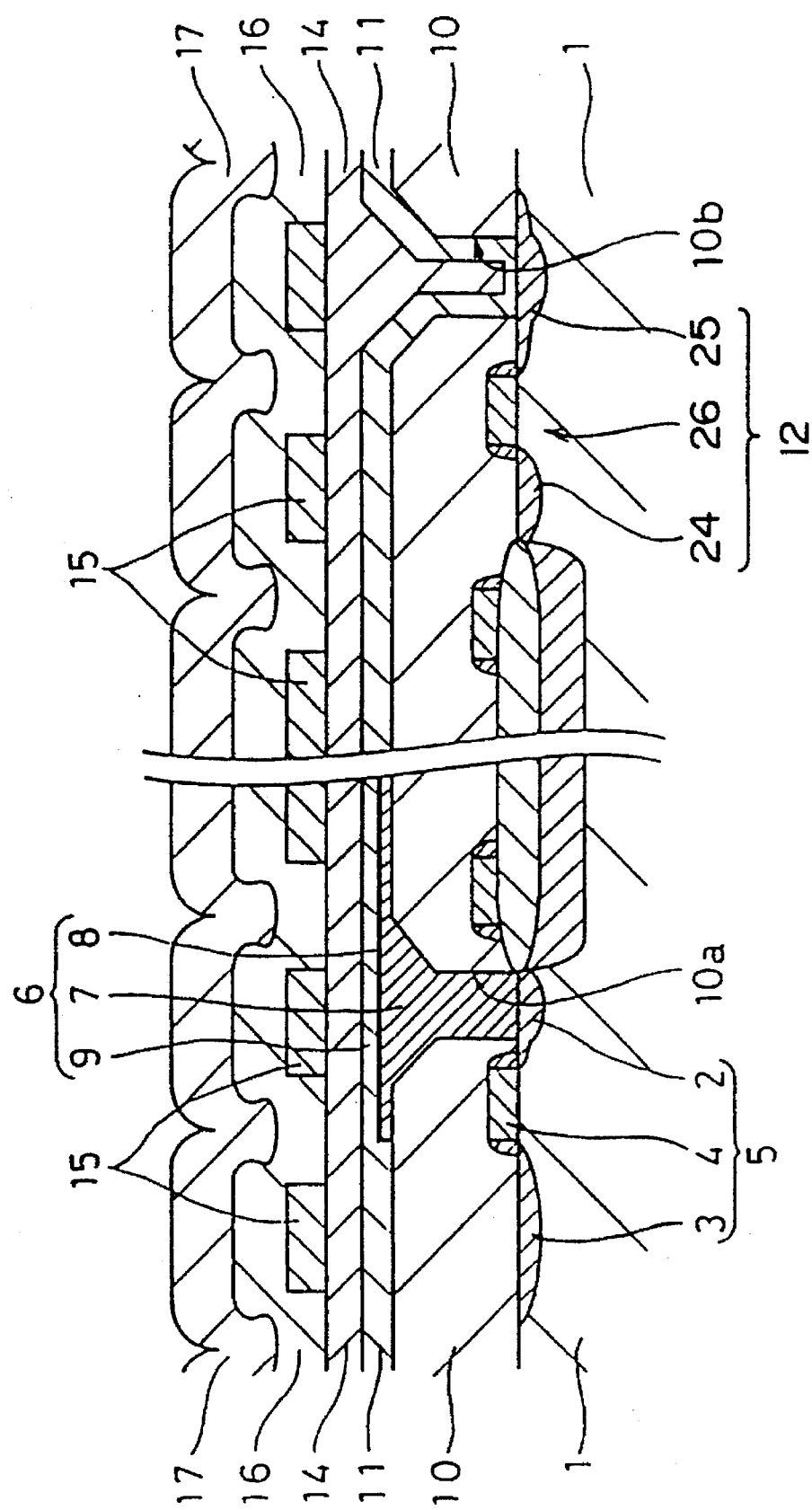
FIG. 12 is a cross-sectional view of a part of a DRAM in accordance with a fifth embodiment of the present invention.
Figure 13:
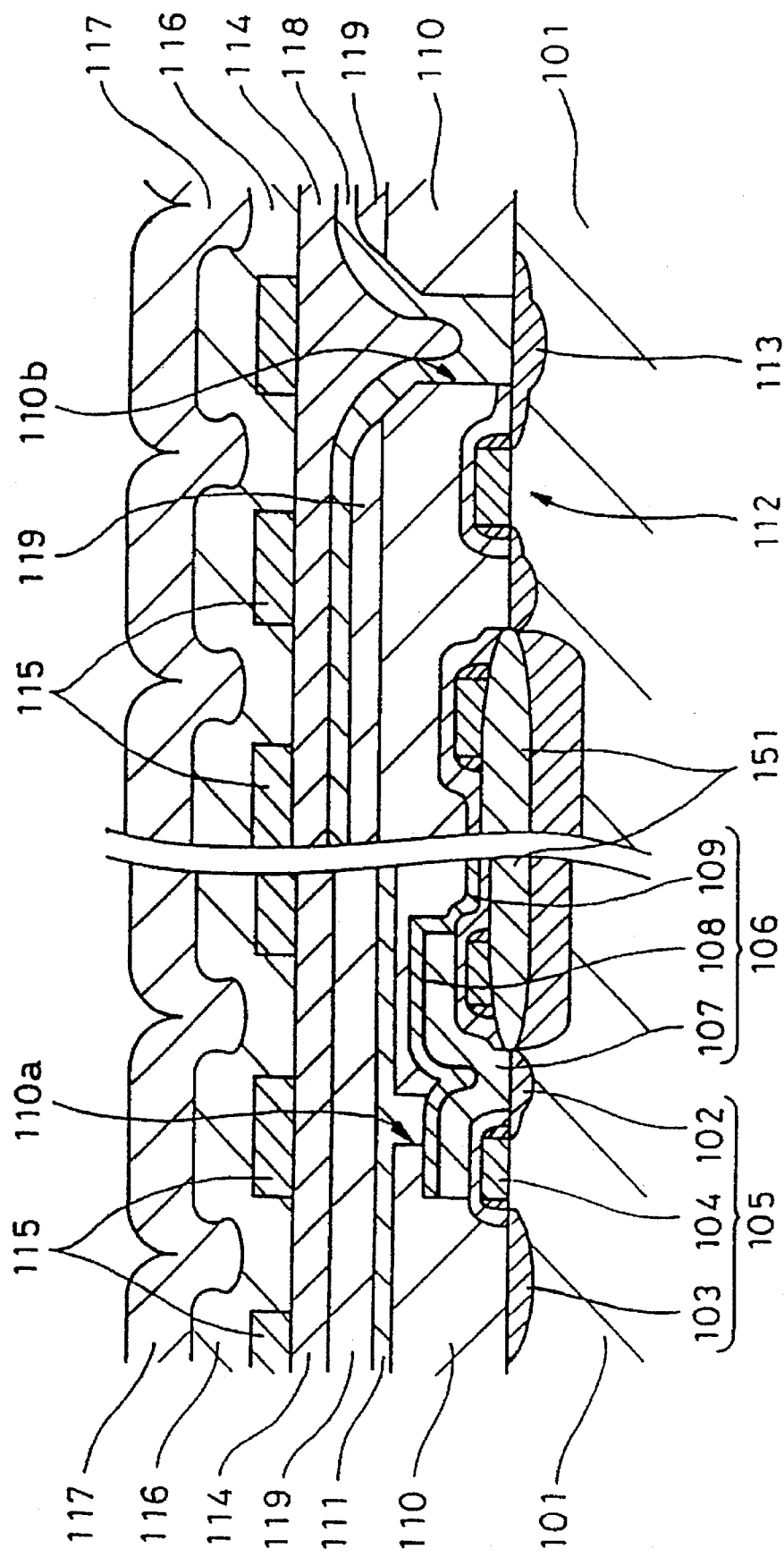
FIG. 13 is a cross-sectional view of a part of a prior art DRAM.

A semiconductor device in accordance with a fifth embodiment of the present invention will be explained with reference to FIG. 12. In the semiconductor device shown in FIG. 12, a lower electrode 7 of a capacitor 6 is formed as substantially embedded into a contact hole 10a, whereby the flatness of the dielectric film 8 and upper electrode 9 is improved over that of the semiconductor device of FIG. 9. Other arrangement is substantially the same as that of the semiconductor device of FIG. 9. In FIG. 12, members having the same functions as those in FIG. 9 are denoted by the same reference numerals.

FIG. 12 is a partial cross-sectional view of the semiconductor device, in which a left side of the drawing denotes a DRAM memory cell part and a right side thereof denotes a transistor part for addressing (row selection) of memory cells.

As shown in the left side of FIG. 12, each capacitor in a group of stack type capacitors 6 includes a lower electrode (storage node) 7, a dielectric film 8, and an upper electrode (cell plate) 9 opposite to the lower electrode 7 with the dielectric film 8 disposed therebetween. The lower electrode 7 of each of the capacitors 6 is connected to the impurity diffused region 2 of the corresponding MOS transistor 5 through the contact hole 10a made in the insulating film 10 on the impurity diffused region 2. In the present embodiment, the lower electrode 7 of the capacitor 6 is formed as substantially completely embedded into the contact hole 10a, so that the dielectric film 8 and upper electrode 9 are formed substantially flat. As a result, a break (electrically improper conduction in the steps) in the upper electrode 9 and in steps of the wiring line 11 made of the same film as the upper electrode 9 to be integral therewith can be substantially completely prevented, thus improving its wiring reliability.

As shown in the right side of FIG. 12, the wiring line 11 is connected to one impurity diffused region 25 of the row selection transistor 12 through the contact hole 10b made in the insulating film 10. Further, the inter-layer insulating film 14, gate line 15, insulating film 16 and protective film 17 are sequentially formed on the wiring lines 11 and upper electrode 9.

The present embodiment is substantially the same as the fourth embodiment regarding the materials of the dielectric film 8, wiring lines 11, upper electrode 9, and lower electrode 7. The fabricating method is also substantially the same as that in the fourth embodiment.

In the foregoing fourth and fifth embodiments of the present invention, since the wiring lines 11 connected to the impurity diffused regions 25 of the row-selection transistors 12 and the upper electrodes 9 of the capacitors 6 of the memory cells are integrally formed with use of the same conductive film, it becomes unnecessary to connect the wiring lines 11 and upper electrodes 9 by means of contact structures for interconnection therebetween. Accordingly, the thickness of the insulating film 10 can be made smaller by an amount corresponding to the contact structures when compared with that of the prior art. As a result, since the aspect ratio of the contact hole 10b for interconnection between the impurity diffused regions 25 of the row-selection transistors 12 and the wiring lines 11 can be made small, the coverage of the wiring lines 11 at the contact hole 10b can be improved with reliable wiring connection.

Further, since such annealing process at a high temperature of above 700° C. as the reflowing process of the insulating film 10, e.g., a BPSG film or the activation process based on contact implantation through the contact holes 10a and 10b can be carried out prior to the formation of the capacitors 6, a dielectric material such as lead titanate having a high dielectric constant of 50 or more can be used as the material of the dielectric film 8 of the capacitors 6. Further, even when electrically conductive oxide material such as ruthenium dioxide is used as the electrode material of the capacitor 6, there can be avoided interdiffusion between the dielectric film 8 and the upper and lower electrodes 9 and 7 or between the upper and lower electrodes 9 and 7 and the semiconductor substrate 1. Therefore, when such materials are employed, the total capacitance of the capacitors 6 can be increased to the secured intended level and thus there can be formed DRAM memory cells made more finely than those in the prior art.

As already explained in the foregoing, in accordance with the present invention, when the capacitor upper electrodes of the memory cells forming the column lines of the memory cell array are integrally formed with their wiring lines using the same conductive film, the aspect ratio of the contact holes for interconnection between, e.g., the bit wiring lines formed at the same height as the upper-electrode wiring lines and one impurity diffused regions of the column-selection transistors can be made small, which results in that the coverage of the wiring lines at the contact holes can be improved and the wiring connection reliability can be enhanced. Further, since the wiring lines can be formed not by an expensive CVD process but by the sputtering process, the semiconductor device can be inexpensively fabricated.

In accordance with the present invention, further, since such a high-temperature annealing process as the insulating-film reflowing process or the impurity activating process can be carried out prior to the formation of the capacitors of the memory cells, a material having a high dielectric constant can be used as the material of the capacitor dielectric film. Since this results in increase in the capacitor capacitance of the memory cells, the area of the memory cells can be made relatively small and thus a semiconductor device can be finely fabricated at a high integration.

In accordance with the present invention, furthermore, since the upper electrodes of the capacitors and their wiring lines can be formed at the same time, the fabricating steps can be simplified.

What is claimed is:

1. A semiconductor memory device having a plurality of memory cells one of which is selected by a plurality of column selection lines and a plurality of row selection lines, said memory device comprising:

a semiconductor substrate;

transistors included in said plurality of memory cells respectively and each having first and second impurity diffused regions formed within said semiconductor substrate and a gate electrode formed on said semiconductor substrate with an insulating film disposed therebetween;

an insulating layer covering said transistors and having at least contact holes made therein located on said first and second impurity diffused regions of said transistors;

capacitor lower electrodes included in said plurality of memory cells respectively and each formed on said insulating layer to be electrically connected to the first impurity diffused region of associated one of said transistors through associated one of said contact holes made in said insulating layer;

capacitor dielectric films included in said plurality of memory cells and formed on said capacitor lower electrodes respectively; and first electrically conductive films and second electrically conductive films adjacent to each other and extended in a column direction and electrically separated from each other, each of said first conductive films being connected to one of said plurality of column selection lines and also connected to said second impurity diffused region of associated one of the transistors in the plurality of memory cells, which are adjacent to each other in the column direction, through associated one of the contact holes made in said insulating layer, each of said second conductive films being connected to a power supply line and including parts formed on the capacitor dielectric films in said plurality of memory cells adjacent to each other in the column direction, said parts being opposite to said capacitor lower electrodes with said capacitor dielectric films disposed therebetween, thereby acting as capacitor upper electrodes.

2. A semiconductor memory device as set forth in claim 1, wherein the gate electrodes of the transistors of said plurality of memory cells, which are adjacent to each other in the row direction, are commonly connected to associated one of said plurality of row selection lines.

3. A semiconductor memory device as set forth in claim 1, wherein two of said plurality of memory cells, which are adjacent to each other in the column direction, share one of said second conductive films.

4. A semiconductor memory device comprising:

a semiconductor substrate having first and second element formation regions;

a first group of field effect transistors for DRAM memory cells formed in said first element formation region of said semiconductor substrate, each of said first group of transistors having first and second impurity diffused regions formed within said semiconductor substrate and a gate electrode formed on said semiconductor substrate with an insulating film disposed therebetween;

a second group of field effect transistors for column selection formed in said second element formation region of said semiconductor substrate;

an insulating layer formed in said first and second element formation regions to cover said first and second field effect transistors and having first contact holes and second contact holes provided on the first and second impurity diffused regions of said first group of field effect transistors respectively and third contact holes and fourth contact holes provided on the first and second impurity diffused regions of said second group of field effect transistors respectively;

capacitor lower electrodes provided on said insulating layer, each of said capacitor lower electrodes being electrically connected to the first impurity diffused region of associated one transistor of said first group of field effect transistors through associated one of said first contact holes provided in said insulating layer;

capacitor dielectric films formed on said capacitor lower electrodes respectively;

capacitor upper electrodes formed on said capacitor dielectric films respectively opposite to said capacitor lower electrodes with said capacitor dielectric films disposed therebetween respectively;

a capacitor upper electrode wiring layer formed on said insulating layer for connecting the capacitor upper electrodes which are arranged in the column direction; and column selection wiring lines formed on said insulating layer electrically isolated from said capacitor upper electrode wiring layer, each of said column selection wiring lines being electrically connected to the second impurity diffused regions of the transistors arranged in the column direction and included in said first group of field effect transistors.

5. A semiconductor memory device as set forth in claim 4, wherein each of said column selection wiring lines includes a first layer formed simultaneously with said capacitor lower electrodes and a second layer formed simultaneously with said capacitor upper electrodes.

6. A semiconductor memory device as set forth in claim 4, wherein each of said column selection wiring lines is formed so as to extend on said insulating film to be electrically connected to the first impurity diffused region of one of said second group of field effect transistors through respective one of said third contact holes.

7. A semiconductor memory device as set forth in claim 5, wherein each of said column selection wiring lines is formed so as to extend on said insulating film to be electrically connected to the first impurity diffused region of one of said second group of field effect transistors through respective one of said third contact holes.

8. A semiconductor memory device as set forth in claim 4, wherein said capacitor upper electrode wiring layer includes a part which is formed so as to extend on said insulating film and electrically connected to the second impurity diffused region of at least one transistor in said second group of field effect transistors through at least one of said fourth contact holes, said part being formed on the identical plane as said capacitor upper electrodes and said column selection wiring lines.

9. A semiconductor memory device as set forth in claim 5, wherein said capacitor upper electrode wiring layer includes a part which is formed so as to extend on said insulating film and electrically connected to the second impurity diffused region of at least one transistor in said second group of field effect transistors through at least one of said fourth contact holes, said part being formed on the identical plane as said capacitor upper electrodes and said column selection wiring lines.

10. A semiconductor memory device as set forth in claim 6, wherein said capacitor upper electrode wiring layer includes a part which is formed so as to extend on said insulating film and electrically connected to the second impurity diffused region of at least one transistor in said second group of field effect transistors through at least one of said fourth contact holes, said part being formed on the identical plane as said capacitor upper electrodes and said column selection wiring lines.

11. A semiconductor memory device as set forth in claim 7, wherein said capacitor upper electrode wiring layer includes a part which is formed so as to extend on said insulating film and electrically connected to the second impurity diffused region of at least one transistor in said second group of field effect transistors through at least one of said fourth contact holes, said part being formed on the identical plane as said capacitor upper electrodes and said column selection wiring lines.

12. A semiconductor memory device having a plurality of memory cells arranged in a matrix form and each having a transistor and a capacitor, wherein:

said capacitor includes a capacitor lower electrode connected to one impurity diffused region of said transistor and a dielectric film formed on said capacitor lower electrode; and said semiconductor memory device comprises in the same plane as an upper surface of an insulating layer on said transistor:

(1) a first electrically conductive region including an electrically conductive layer covering said lower electrodes of the capacitors in said plurality of memory cells, which are adjacent to each other in a column direction, with said dielectric films disposed therebetween to form capacitor upper electrodes of said capacitors respectively and also to form a wiring region extended in the column direction to connect the capacitor upper electrodes of said plurality of memory cells which are adjacent to each other in the column direction; and (2) a second electrically conductive region including an electrically conductive layer connected to the other impurity diffused regions of the transistors in said plurality of memory cells, which are adjacent to each other in the column direction, through contact holes provided in said insulating layer to form a column selection conductive layer disposed on said insulating layer and separated from said first conductive region by an insulating region.

13. A semiconductor memory device as set forth in claim 12, wherein two of said plurality of memory cells, which are adjacent to each other in the column direction, share said first conductive region.

14. A semiconductor memory device including a plurality of memory cells arranged in a matrix form and each having a transistor and a capacitor and also including a plurality of column selection lines and a plurality of row selection lines, one of said memory cells being selected by said plurality of column and row selection lines, wherein:

said capacitor includes a capacitor lower electrode connected to one impurity diffused region of said transistor and a dielectric film formed on said capacitor lower electrode; and said semiconductor memory device comprising:

(1) a first electrically conductive layer including a plurality of electrically conductive wiring lines formed as divided in a row direction on an insulating layer on the transistors of said plurality of memory cells, parts of said plurality of conductive wiring lines being opposed to said capacitor lower electrodes with said dielectric film disposed therebetween; and (2) a second electrically conductive layer arranged between said plurality of conductive wiring lines on said insulating layer, connected to the other impurity diffused regions of a predetermined number of transistors in said plurality of memory cells to form said column selection lines, and formed in the same plane as said first conductive layer.

15. A semiconductor memory device as set forth in claim 14, wherein two of the conductive wiring lines adjacent in the row direction of said first conductive layer are arranged to sandwich one of said column selection lines of said second conductive layer.

16. A semiconductor memory device as set forth in claim 1, wherein said capacitor dielectric films are made of at least one selected from a group of lead titanate, lead titanate zirconium, lead titanate zirconium lanthanum, strontium titanate, strontium titanate barium, tantalum oxide, bismuth oxide, yttrium oxide, zirconium oxide, and tungsten bronze.

17. A semiconductor memory device as set forth in claim 4, wherein said capacitor dielectric films are made of at least one member selected from a group of lead titanate, lead titanate zirconium, lead titanate zirconium lanthanum, strontium titanate, strontium titanate barium, tantalum oxide, bismuth oxide, yttrium oxide, zirconium oxide, and tungsten bronze.

18. A semiconductor memory device as set forth in claim 12, wherein said capacitor dielectric film is made of at least one member selected from a group of lead titanate, lead titanate zirconium, lead titanate zirconium lanthanum, strontium titanate, strontium titanate barium, tantalum oxide, bismuth oxide, yttrium oxide, zirconium oxide, and tungsten bronze.

19. A semiconductor memory device as set forth in claim 14, wherein said capacitor dielectric film is made of at least one member selected from a group of lead titanate, lead titanate zirconium, lead titanate zirconium lanthanum, strontium titanate, strontium titanate barium, tantalum oxide, bismuth oxide, yttrium oxide, zirconium oxide, and tungsten bronze.

20. A semiconductor memory device as set forth in claim 1, wherein said plurality of first and second electrically conductive films are made of at least one member selected from a group of ruthenium dioxide, vanadium oxide indium oxide, platinum, silver, titanium and polycrystalline silicon containing an impurity.

21. A semiconductor memory device as set forth in claim 4, wherein at least one of said capacitor upper electrodes, said capacitor upper electrode wiring layer, and said capacitor lower electrodes is made of at least one member selected from a group of ruthenium dioxide, vanadium oxide, indium oxide, platinum, silver, titanium and polycrystalline silicon containing an impurity.

22. A semiconductor memory device as set forth in claim 12, wherein at least one of said capacitor lower electrode, said first and second electrically conductive regions is made of at least one member selected from a group of ruthenium dioxide, vanadium oxide, indium oxide, platinum, silver, titanium and polycrystalline silicon containing an impurity.

23. A semiconductor memory device as set forth in claim 14, wherein at least one member of said capacitor lower electrode, said first and second electrically conductive layers is made of at least one selected from a group of ruthenium dioxide, vanadium oxide, indium oxide, platinum, silver, titanium and polycrystalline silicon containing an impurity.

24. A semiconductor memory device as set forth in claim 1, wherein each of said dielectric films has 3-layered structure of an oxide layer, a nitride layer and an oxide layer.

25. A semiconductor memory device as set forth in claim 4, wherein each of said dielectric films has 3-layered structure of an oxide layer, a nitride layer and an oxide layer.

26. A semiconductor memory device as set forth in claim 12, wherein said dielectric film has 3-layered structure of an oxide layer, a nitride layer and an oxide layer.

27. A semiconductor memory device as set forth in claim 14, wherein said dielectric film has 3-layered structure of an oxide layer, a nitride layer and an oxide layer.

* * * * *